(12) United States Patent
Chen et al.

(10) Patent No.: US 11,950,468 B2
(45) Date of Patent: Apr. 2, 2024

(54) DISPLAY PANEL, METHOD OF MANUFACTURING THE SAME AND DISPLAY DEVICE

(71) Applicant: BOE Technology Group Co., Ltd., Beijing (CN)

(72) Inventors: Yipeng Chen, Beijing (CN); Lujiang Huangfu, Beijing (CN); Libin Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/762,975

(22) PCT Filed: Apr. 15, 2021

(86) PCT No.: PCT/CN2021/087370
§ 371 (c)(1),
(2) Date: Mar. 23, 2022

(87) PCT Pub. No.: WO2021/227760
PCT Pub. Date: Nov. 18, 2021

(65) Prior Publication Data
US 2022/0336566 A1 Oct. 20, 2022

(30) Foreign Application Priority Data
May 9, 2020 (CN) .......................... 202010387359.4

(51) Int. Cl.
*H10K 59/131* (2023.01)
*G09G 3/3225* (2016.01)
(Continued)

(52) U.S. Cl.
CPC ......... *H10K 59/131* (2023.02); *G09G 3/3225* (2013.01); *H10K 59/1213* (2023.02);
(Continued)

(58) Field of Classification Search
CPC ..... H10K 59/131; H10K 71/00; G09G 3/3225
See application file for complete search history.

(56) References Cited

U.S. PATENT DOCUMENTS 9,853,096 B1 12/2017 Choi et al.
10,236,333 B2 * 3/2019 Kim ..................... H10K 59/131
(Continued)

FOREIGN PATENT DOCUMENTS

CN 105243986 A 1/2016
CN 106097964 A 11/2016
(Continued)

OTHER PUBLICATIONS

PCT/CN2021/087370 international search report and written opinion.
(Continued)

*Primary Examiner* — Sardis F Azongha
(74) *Attorney, Agent, or Firm* — IPro, PLLC

(57) ABSTRACT

The present disclosure provides a display panel, a method of manufacturing the same, and a display device. The initialization signal line layer in the display panel includes an initialization signal line pattern arranged in each of the plurality of sub-pixel areas; the first auxiliary signal line layer includes a plurality of first auxiliary signal line patterns corresponding to the plurality of sub-pixel areas in a one-to-one manner, and the first auxiliary signal line pattern is coupled to an initialization signal line pattern in a corresponding sub-pixel area, at least part of the first auxiliary signal line pattern extends along the first direction, and first auxiliary signal line patterns corresponding to sub-pixel areas in a same row of sub-pixel areas are sequentially coupled.

14 Claims, 19 Drawing Sheets

(51) Int. Cl.
*H10K 59/121* (2023.01)
*H10K 71/00* (2023.01)
*H10K 59/12* (2023.01)
*H10K 59/35* (2023.01)

(52) U.S. Cl.
CPC ......... *H10K 59/1216* (2023.02); *H10K 71/00* (2023.02); *G09G 2300/0426* (2013.01); *G09G 2300/0465* (2013.01); *G09G 2300/0842* (2013.01); *H10K 59/1201* (2023.02); *H10K 59/351* (2023.02)

(56) References Cited

U.S. PATENT DOCUMENTS

| | | | |
|---|---|---|---|
| 10,304,920 B2 * | 5/2019 | Choi | H01L 29/78633 |
| 10,516,015 B2 * | 12/2019 | Xin | H10K 59/131 |
| 10,854,684 B2 * | 12/2020 | Huangfu | H10K 50/8428 |
| 11,257,897 B2 * | 2/2022 | Cha | H10K 59/131 |
| 11,348,992 B2 * | 5/2022 | Oh | H10K 59/1213 |
| 11,600,688 B2 * | 3/2023 | Park | H10K 59/1315 |
| 2009/0009070 A1 | 1/2009 | Chan et al. | |
| 2013/0057532 A1 | 3/2013 | Lee et al. | |
| 2013/0241916 A1 | 9/2013 | Takasugi et al. | |
| 2016/0042692 A1 | 2/2016 | Ota et al. | |
| 2017/0221418 A1 | 8/2017 | Xiang et al. | |
| 2017/0263186 A1 | 9/2017 | Wang et al. | |
| 2017/0317158 A1 | 11/2017 | Choi et al. | |
| 2018/0315374 A1 | 11/2018 | Zhang et al. | |
| 2020/0279899 A1 | 9/2020 | Zhang et al. | |
| 2021/0083031 A1 | 3/2021 | Fang et al. | |
| 2021/0193775 A1 * | 6/2021 | Kang | H10K 59/131 |
| 2022/0036818 A1 | 2/2022 | Yin | |

FOREIGN PATENT DOCUMENTS

| | | |
|---|---|---|
| CN | 106205470 A | 12/2016 |
| CN | 106448555 A | 2/2017 |
| CN | 108227263 A | 6/2018 |
| CN | 108777260 A | 11/2018 |
| CN | 109461407 A | 3/2019 |
| CN | 109742131 A | 5/2019 |
| CN | 110085651 A | 8/2019 |
| CN | 110520923 A | 11/2019 |
| CN | 110867525 A | 3/2020 |
| CN | 210349260 U | 4/2020 |
| CN | 111477669 A | 7/2020 |
| EP | 2983205 A1 | 2/2016 |
| JP | 2001142412 A | 5/2001 |
| JP | 2009212219 A | 9/2009 |

OTHER PUBLICATIONS

PCT/CN2021/073363 international search report and written opinion.

EP21804395.8 extended European search repor.

* cited by examiner

DISPLAY PANEL, METHOD OF MANUFACTURING THE SAME AND DISPLAY DEVICE

CROSS-REFERENCE TO RELATED APPLICATION

This application is the U.S. national phase of PCT Application No. PCT/CN2021/087370 filed on Apr. 15, 2021, which claims priorities of the Chinese patent application No. 202010387359.4 filed on May 9, 2020, which is incorporated herein by reference in its entity.

TECHNICAL FIELD

The present disclosure relates to the field of display technology, and more particularly to a display panel, a method of manufacturing the same and a display device.

BACKGROUND

Active-matrix organic light-emitting diode (AMOLED) display panels are widely used in various fields due to their advantages of self-luminescence, low power consumption, and fast response speed. The AMOLED display panel includes a sub-pixel driving circuit and a light-emitting unit, and the corresponding light-emitting unit is driven to emit light by the sub-pixel driving circuit, so as to realize the display function of the display panel.

However, as the resolution of the display panel becomes higher and higher, the layout space in the display panel becomes smaller and smaller. When the initialization signal line pattern used to provide the initialization signal for the sub-pixel driving circuit is laid out, the initialization signal line patterns in the same row are not easily connected together, resulting in increased production cost of the display panel.

SUMMARY

The objective of the present disclosure is to provide a display panel, a method of manufacturing the same, and a display device.

In order to achieve the above object, the present disclosure provides the following technical solutions:

A first aspect of the present disclosure provides a display panel, including: a substrate, an initialization signal line layer and a first auxiliary signal line layer sequentially stacked on the substrate along a direction away from the substrate; and a plurality of sub-pixel areas arranged in an array, wherein the plurality of sub-pixel areas form a plurality of rows of sub-pixel areas arranged in sequence along a second direction, each row of sub-pixel areas includes a plurality of sub-pixel areas arranged along a first direction, the first direction and the second direction intersect; the initialization signal line layer includes an initialization signal line pattern arranged in each of the plurality of sub-pixel areas; the first auxiliary signal line layer includes a plurality of first auxiliary signal line patterns corresponding to the plurality of sub-pixel areas in a one-to-one manner, and the first auxiliary signal line pattern is coupled to an initialization signal line pattern in a corresponding sub-pixel area, at least part of the first auxiliary signal line pattern extends along the first direction, and first auxiliary signal line patterns corresponding to sub-pixel areas in a same row of sub-pixel areas are sequentially coupled.

Optionally, the display panel further includes: a conductive connection portion layer located on a side of the first auxiliary signal line layer away from the substrate, wherein the conductive connection portion layer includes second conductive connection portions corresponding to the plurality of the sub-pixel areas in a one-to-one manner; in the same sub-pixel area, there is a first overlapping area between an orthographic projection of the second conductive connection portion on the substrate and an orthographic projection of the initialization signal line pattern on the substrate, and there is a second overlapping area between the orthographic projection of the second conductive connection portion on the substrate and the first auxiliary signal line pattern, the second conductive connection portion is coupled to the initialization signal line pattern in the first overlapping area, and the second conductive connection portion is coupled to the first auxiliary signal line layer pattern in the second overlapping area.

Optionally, the first auxiliary signal line pattern includes a first portion and a second portion coupled to each other, and the first portion extends along the first direction, the second portion protrudes from the first portion along a direction perpendicular to the first direction; an orthographic projection of the first portion on the substrate overlaps the orthographic projection of the initialization signal line pattern on the substrate overlap, and an orthographic projection of the second portion on the substrate does not overlap the orthographic projection of the initialization signal line pattern on the substrate; in the same sub-pixel area, there is the second overlapping area between the orthographic projection of the second portion on the substrate and the orthographic projection of the second conductive connection portion on the substrate.

Optionally, there is a third overlapping area between the orthographic projection of the first auxiliary signal line pattern on the substrate and the orthographic projection of the initialization signal line pattern on the substrate, the first auxiliary signal line pattern is directly coupled to the initialization signal line pattern through a via hole located in the third overlapping area.

Optionally, the first auxiliary signal line pattern includes a third portion and a fourth portion, the third portion extends along the first direction, in the direction perpendicular to the first direction, a width of the fourth portion is greater than a width of the third portion; there is the third overlapping area between an orthographic projection of the fourth portion on the substrate and the orthographic projection of the initialization signal line pattern on the substrate.

Optionally, the display panel further includes a power signal line layer and a data line layer that are sequentially stacked on the first auxiliary signal line layer along a direction away from the substrate; the power signal line layer includes a power signal line pattern located in each of the plurality of sub-pixel areas, and at least part of the power signal line pattern extends along the second direction; the data line layer includes a data line pattern located in each of the plurality of sub-pixel areas, and at least part of the data line pattern extends along the second direction; in the same sub-pixel area, an orthographic projection of the power signal line pattern on the substrate overlaps an orthographic projection of the data line pattern on the substrate.

Optionally, the display panel further includes: a power supply signal line layer located on a side of the initialization signal line layer away from the substrate, wherein the power supply signal line layer includes a power supply signal line pattern arranged in each of the plurality of sub-pixel areas, at least part of the power supply signal line pattern extends along the second direction; a third auxiliary signal line layer located between the initialization signal line layer and the power supply signal line layer, wherein the third auxiliary signal line layer includes a third auxiliary signal line pattern located in each of the plurality of sub-pixel areas, at least part of the third auxiliary signal line pattern extends along the first direction; in the same sub-pixel area, there is a fourth overlapping area between an orthographic projection of the third auxiliary signal line pattern on the substrate and an orthographic projection of the power signal line pattern on the substrate, and the third auxiliary signal line pattern is coupled to the power signal line pattern in the fourth overlapping area; third auxiliary signal line patterns in a same row of sub-pixel areas along the first direction are sequentially coupled.

Optionally, the display panel further includes: a light-emitting control signal line layer, wherein the light-emitting control signal line layer includes a light-emitting control signal line pattern located in each of the plurality of sub-pixel areas, and at least part of the light-emitting control signal line pattern extends along the first direction; a reset signal line layer, wherein the reset signal line layer includes a reset signal line pattern located in each of the plurality of sub-pixel areas, and the reset signal line pattern extends along the first direction; in the same sub-pixel area, the orthographic projection of the third auxiliary signal line pattern on the substrate is located between the orthographic projection of the light-emitting control signal line pattern on the substrate and the orthographic projection of the reset signal line pattern on the substrate, the third auxiliary signal line pattern is formed in a wavy structure.

Optionally, the display panel further includes a transistor structure and a storage capacitor, and the storage capacitor includes a first electrode plate and a second electrode plate opposite to each other, the first electrode plate is located between the substrate and the second electrode plate, and the first electrode plate and a gate electrode of the transistor structure are arranged at a same layer and made of a same material; the first auxiliary signal line layer and/or the third auxiliary signal line layer are arranged at a same layer and made of a same material as the second electrode plate.

Optionally, the display panel further includes: a gate line layer, wherein the gate line layer includes a gate line pattern located in each of the plurality of sub-pixel areas, and at least part of the gate line pattern extends along the first direction; a data line layer, wherein the data line layer includes a data line pattern located in each of the plurality of sub-pixel areas, at least part of the data line pattern extends along the second direction, and an orthographic projection of the data line pattern on the substrate overlaps an orthographic projection of the gate line pattern on the substrate; a conductive connection portion layer, wherein the conductive connection portion layer includes a third conductive connection portion and a fourth conductive connection portion located in each of the plurality of sub-pixel areas; sub-pixel driving circuits corresponding to the plurality of sub-pixel areas in a one-to-one manner, each of the plurality of sub-pixel driving circuits includes: a driving transistor, a storage capacitor, a first transistor and a second transistor; a gate electrode of the driving transistor is multiplexed as a first electrode plate of the storage capacitor, and the gate electrode of the driving transistor is coupled to a second electrode of the second transistor through the fourth conductive connection portion in the corresponding sub-pixel area, and the second electrode plate of the storage capacitor is coupled to a second electrode of the first transistor through the third conductive connection portion in the corresponding sub-pixel area; a gate electrode of the first transistor and a gate electrode of the second transistor are respectively coupled to the gate line pattern in the corresponding sub-pixel area; an orthographic projection of the gate line pattern on the substrate does not overlap an orthographic projection of the third conductive connection portion on the substrate, and/or the orthographic projection of the gate line pattern on the substrate does not overlap an orthographic projection of the fourth conductive connection portion on the substrate.

Optionally, the display panel further includes: a gate line pattern and a reset signal line pattern arranged in each of the plurality of sub-pixel areas, a gate line pattern in a current sub-pixel area and a reset signal line pattern in a next sub-pixel area adjacent along the second direction form an integral structure.

Optionally, the display panel further includes a transistor structure, wherein the initialization signal line pattern and an active layer in the transistor structure are arranged at a same layer and made of a same material.

Optionally, the display panel further comprises: a power signal line pattern, a data line pattern, a gate line pattern, a reset signal line pattern, and a light-emitting control signal line pattern in each of the plurality of sub-pixel areas; and the sub-pixel driving circuits corresponding to the plurality of sub-pixel areas in a one-to-one manner, each of sub-pixel driving circuits includes: a first transistor, a second transistor, a third transistor, a fourth transistor, a fifth transistor, a sixth transistor, a seventh transistor, an eighth transistor, and a ninth transistor; a gate electrode of the first transistor is coupled to the gate line pattern, a first electrode of the first transistor is coupled to the data line pattern, and a second electrode of the first transistor is coupled to a second electrode plate of the storage capacitor, and a first electrode plate of the storage capacitor is coupled to a gate electrode of the third transistor; a gate electrode of the second transistor is coupled to the gate line pattern, a first electrode of the second transistor is coupled to a second electrode of the third transistor, and a second electrode of the second transistor is coupled to the gate electrode of the third transistor; a first electrode of the third transistor is coupled to the power signal line pattern; a gate electrode of the fourth transistor is coupled to the reset signal line pattern, a first electrode of the fourth transistor is coupled to the initialization signal line pattern, and a second electrode of the fourth transistor is coupled to the gate electrode of the third transistor; a gate electrode of the fifth transistor is coupled to the reset signal line pattern, a first electrode of the fifth transistor is coupled to the initialization signal line pattern, and a second electrode of the fifth transistor is coupled to a second electrode plate of the storage capacitor; a gate electrode of the sixth transistor is coupled to the light-emitting control signal line pattern, a first electrode of the sixth transistor is coupled to the initialization signal line pattern, and a second electrode of the sixth transistor is coupled to the second electrode plate of the storage capacitor; a gate electrode of the seventh transistor is coupled to the light-emitting control signal line pattern, a first electrode of the seventh transistor is coupled to the second electrode of the third transistor, and a second electrode of the seventh transistor is coupled to a corresponding anode pattern in the display panel; a gate electrode of the eighth transistor is coupled to the reset signal line pattern, a first electrode of the eighth transistor is coupled to the initialization signal line pattern, and a second electrode of the eighth transistor is coupled to the corresponding anode pattern; a gate electrode of the ninth transistor is coupled to a corresponding light-emitting control signal line pattern, a first electrode of the ninth transistor is coupled to the gate electrode of the third transistor, and a second electrode of the ninth transistor is floating.

In a second aspect, a display device including the display panel.

In a third aspect, a method of manufacturing a display panel, wherein the display panel includes a plurality of sub-pixel areas arranged in an array, and the plurality of sub-pixel areas are formed as a plurality of rows of sub-pixel areas arranged in sequence along a second direction, each row of sub-pixel areas includes a plurality of sub-pixel areas arranged along a first direction, and the first direction intersects the second direction; the method includes: forming an initialization signal line layer and a first auxiliary signal line layer that are stacked in sequence on the substrate along a direction away from the substrate; the initialization signal line layer includes an initialization signal line pattern arranged in each of plurality of the sub-pixel areas; the first auxiliary signal line layer includes a plurality of first auxiliary signal line patterns corresponding to the plurality of sub-pixel areas in a one-to-one manner, and the first auxiliary signal line pattern is coupled to the initialization signal line pattern in the corresponding sub-pixel area; at least part of the first auxiliary signal line pattern extends along the first direction, and in a same row of sub-pixel areas, the first auxiliary signal line patterns corresponding to the plurality of sub-pixel areas are sequentially coupled.

BRIEF DESCRIPTION OF THE DRAWINGS

The drawings described here are used to provide a further understanding of the present disclosure and constitute a portion of the present disclosure. The exemplary embodiments and descriptions of the present disclosure are used to explain the present disclosure, and do not constitute an improper limitation of the present disclosure.

DETAILED DESCRIPTION

In order to further illustrate the display panel, the manufacturing method thereof, and the display device provided by the embodiments of the present disclosure, a detailed description is given below with reference to the accompanying drawings.

Figure 3:
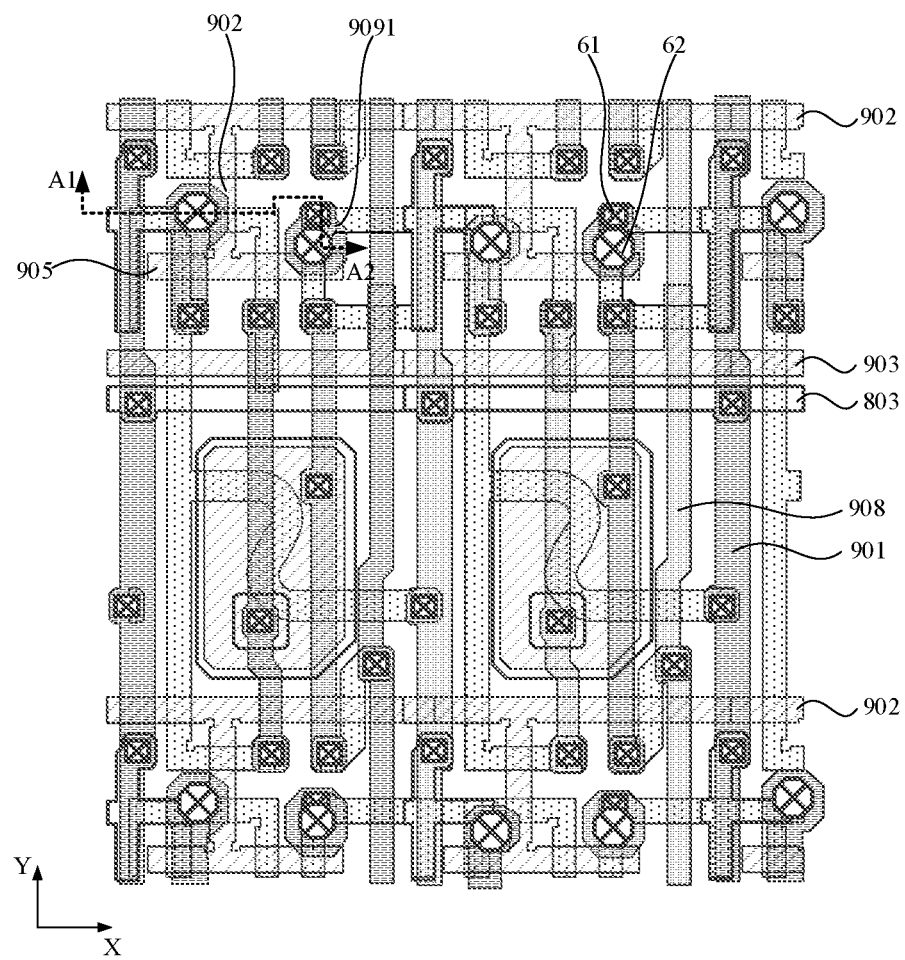
FIG. 3 is a schematic diagram of a first layout of two sub-pixel areas in a display panel according to an embodiment of the present disclosure.
Figure 4:
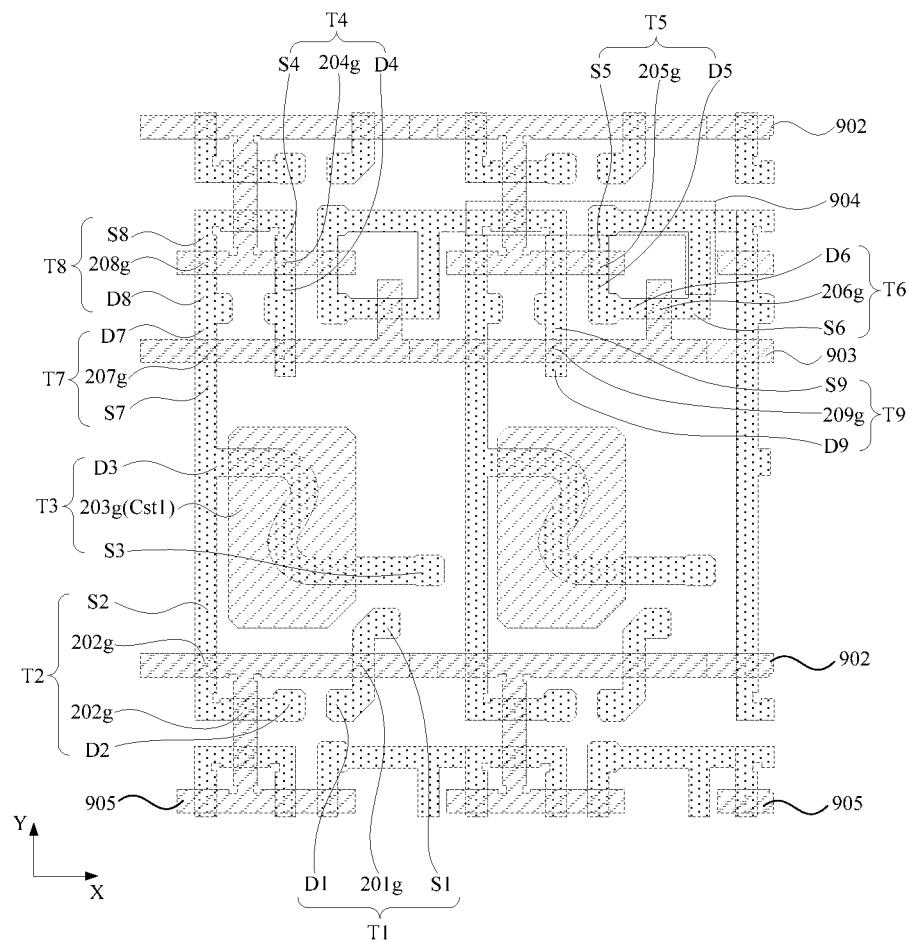
FIG. 4 is a schematic diagram of the layout of the active layer and the first gate metal layer in FIG. 3.
Figure 5:
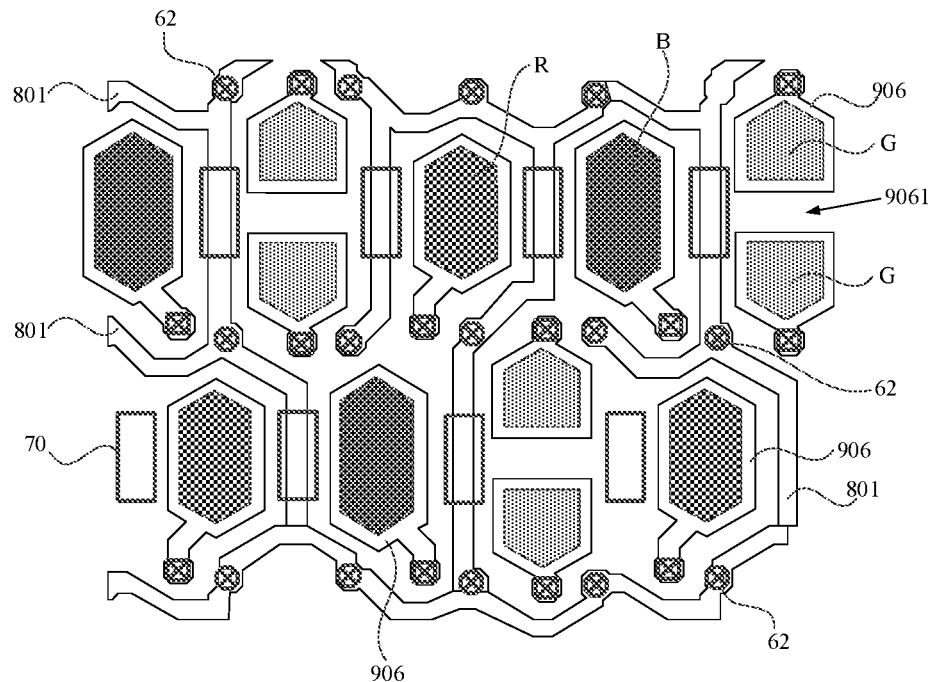
FIG. 5 is a schematic diagram of a first auxiliary signal line layer located in an anode spacing area according to an embodiment of the present disclosure.
Figure 7:
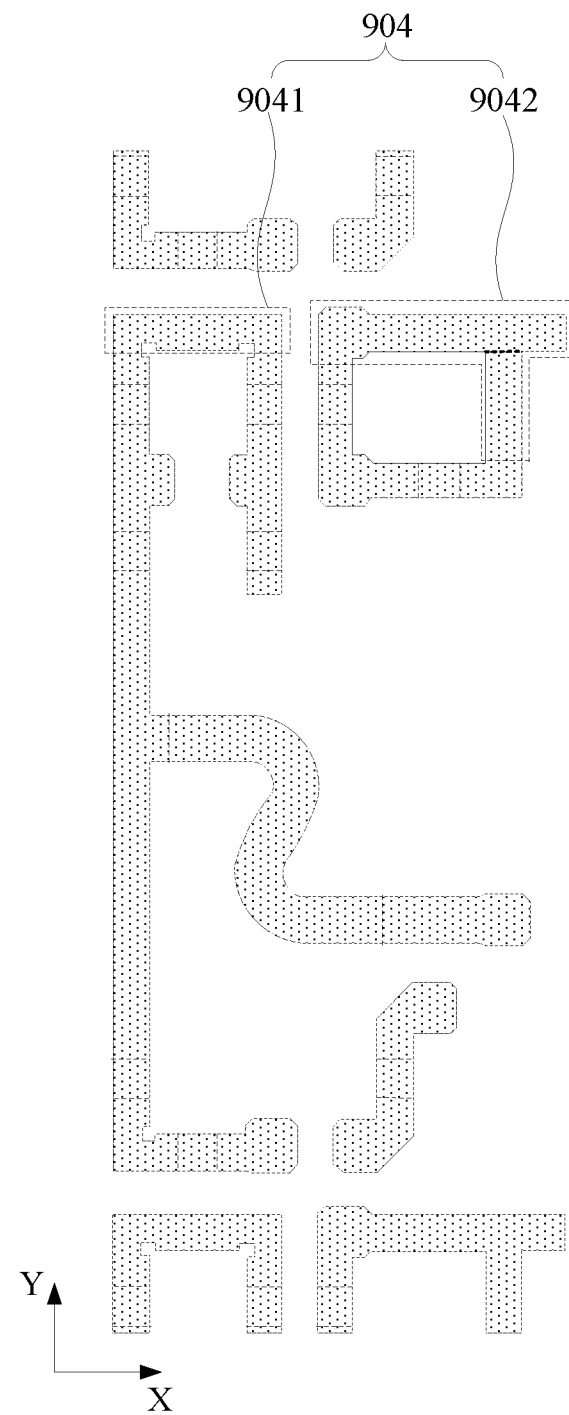
FIG. 7 is a schematic diagram of the layout of an active layer in one sub-pixel area in FIG. 3.

Referring to FIGS. 1 to 5, an embodiment of the present disclosure provides a display panel, including: a substrate, and an initialization signal line layer and an anode layer that are sequentially stacked on the substrate along a direction away from the substrate; further including: a plurality of sub-pixel areas arranged in an array;

As shown in FIG. 3, FIG. 4 and FIG. 7, the initialization signal line layer includes an initialization signal line pattern 904 arranged in each of the sub-pixel areas;

As shown in FIG. 5, the anode layer includes a plurality of anode patterns 906 corresponding to the plurality of sub-pixel areas in a one-to-one manner, the plurality of anode patterns 906 are arranged at intervals, and an anode spacing area 9061 is formed between adjacent anode patterns 906.

As shown in FIG. 5, the display panel further includes: a first auxiliary signal line layer 801, the first auxiliary signal line layer 801 is a grid structure, and at least part of the first auxiliary signal line layer 801 is located in the anode spacing area 9061, and is insulated from the anode pattern 906, and the initialization signal line pattern 904 in each of the sub-pixel areas is coupled to the first auxiliary signal line layer 801.

Specifically, the plurality of sub-pixel areas arranged in the array can be divided into multiple rows of sub-pixel areas sequentially arranged along the second direction, and multiple columns of sub-pixel areas sequentially arranged along the first direction. Each row of sub-pixel areas includes a plurality of sub-pixel areas spaced along the first direction, and each column of sub-pixel areas includes a plurality of sub-pixel areas spaced along the second direction. The first direction intersects the second direction. Exemplarily, the first direction includes the X direction, and the second direction includes the Y direction.

The initialization signal line layer includes a plurality of initialization signal line patterns 904, the plurality of initialization signal line patterns 904 correspond to the plurality of sub-pixel areas in a one-to-one manner, and the initialization signal line pattern 904 are located in the corresponding sub-pixel area, is used to provide an initialization signal for the sub-pixel driving circuit corresponding to the sub-pixel area.

The anode layer is located on a side of the sub-pixel driving circuit in the display panel away from the substrate, and the anode layer includes a plurality of anode patterns 906, and the plurality of anode patterns 906 are spaced from each other. An anode spacing area 9061 is formed between adjacent anode patterns 906. The anode patterns 906 correspond to the sub-pixel driving circuits in the display panel in a one-to-one manner. The anode pattern 906 is coupled to the corresponding sub-pixel driving circuit and can receive a driving signal provided by the corresponding sub-pixel driving circuit. A light-emitting functional layer and a cathode layer is further arranged at a side of the anode layer away from the substrate, the light-emitting functional layer is located between the anode layer and the cathode layer, and can emit light of the corresponding color under the action of the electric field formed between the anode layer and the cathode layer. It should be noted that the light-emitting functional layer may specifically include a hole injection layer, a hole transport layer, an organic light-emitting material layer, an electron transport layer and an electron injection layer that are stacked, but is not limited thereto. FIG. 5 shows a red light-emitting element R, a green light-emitting element G, and a blue light-emitting element B, and light-emitting elements of different colors correspond to organic light-emitting material layers of different colors.

As shown in FIG. 5, the display panel further includes a first auxiliary signal line layer 801, and at least part of the first auxiliary signal line layer 801 is arranged in the anode spacing area 9061 and insulated from the anode pattern 906. The anode spacing area 9061 is formed as a grid area, so that the first auxiliary signal line layer 801 arranged in the anode spacing area 9061 is formed into a grid structure. Exemplarily, the first auxiliary signal line layer 801 may be laid out in all the anode spacing areas 9061 in the display panel. In addition, the reference No. 70 in FIG. 5 represents a spacer.

Figure 6:
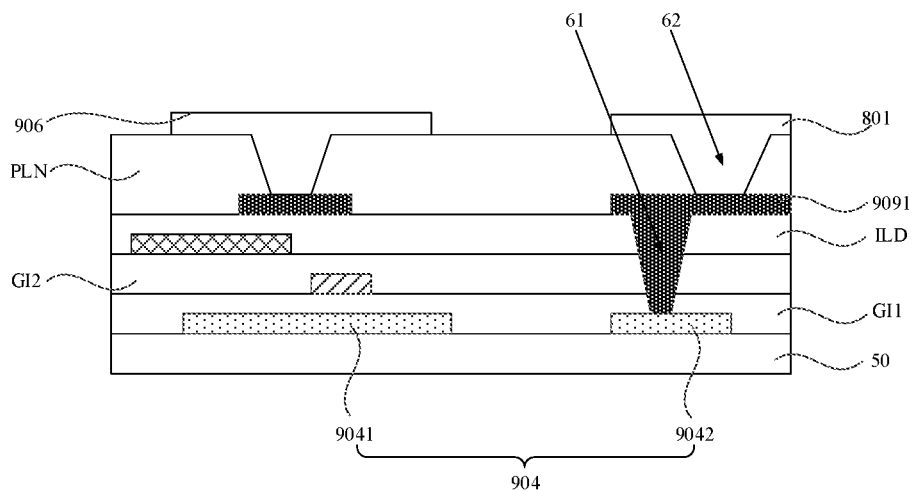
FIG. 6 is a schematic cross-sectional view along the A1A2 direction in FIG. 3.

It is worth noting that, as shown in FIG. 6, the display panel further includes a planarization layer PLN, and the anode layer (including the anode pattern 906) is generally formed on the surface of the planarization layer PLN away from the substrate 50. The first auxiliary signal line layer 801 is arranged in the anode spacing area 9061, so that the first auxiliary signal line layer 801 is also arranged on the surface of the planarization layer PLN away from the substrate 50. An auxiliary signal line layer 801 is arranged at the same layer as the anode layer to avoid increasing the thickness of the display panel due to the introduction of the first auxiliary signal line layer 801.

The first auxiliary signal line layer 801 is arranged in the anode spacing area 9061, so that the first auxiliary signal line layer 801 is located on the side of the initialization signal line pattern 904 away from the substrate 50, for example, a via hole can be provided between the first auxiliary signal line layer 801 and the initialization signal line pattern 904, so that the first auxiliary signal line layer 801 and the initialization signal line pattern 904 can be coupled through the via hole.

According to the specific structure of the above-mentioned display panel, the display panel provided by the embodiment of the present disclosure includes an initialization signal line pattern 904 located in each sub-pixel area, and a grid-shaped first auxiliary signal line layer 801 located in the anode spacing area 9061 is respectively coupled to the first auxiliary signal line layer 801 by setting the initialization signal line pattern 904 in each of the sub-pixel areas, so that the first auxiliary signal line layer 801 couples all the initialization signal line patterns 904 together, so that the first auxiliary signal line layer 801 can provide an initialization signal for the initialization signal line pattern 904 in each sub-pixel area; therefore, in the display panel provided by the embodiments of the present disclosure, the initialization signal line pattern 904 in each sub-pixel area is respectively coupled to the first auxiliary signal line layer 801 arranged in the anode spacing area 9061, which solves the problem that the initialization signal line patterns 904 in the same row are not easily connected together due to the limited layout space of the display panel.

Moreover, in the display panel provided by the embodiment of the present disclosure, the first auxiliary signal line layer 801 may be arranged in all the anode spacing areas 9061 in the display area, and the initialization signal line pattern 904 in each sub-pixel area is coupled to the first auxiliary signal line layer 801, so as to ensure the stability of the initialization signal transmitted on the initialization signal line pattern 904 in each sub-pixel area. In addition, by arranging the first auxiliary cathode layer in the anode spacing area 9061, the first auxiliary signal line layer 801 and the anode layer can be arranged at the same layer, which is more beneficial to the thinning of the display panel.

It should be noted that the initialization signal line pattern 904 provided in the above-mentioned embodiment is not only used to provide the initialization signal (Vinit) for the corresponding sub-pixel driving circuit, but also can be used to provide the reference signal (Vref) for the corresponding sub-pixel driving circuit.

As shown in FIG. 3, FIG. 5 and FIG. 6, in some embodiments, the display panel further includes:

a conductive connection portion layer located between the initialization signal line layer and the first auxiliary signal line layer 801, the conductive connection portion layer includes a first conductive connection portion 9091 arranged in each of the sub-pixel areas; in the same sub-pixel area, there is a first overlapping area between an orthographic projection of the first conductive connection portion 9091 on the substrate 50 and an orthographic projection of the initialization signal line pattern 904 (the first sub-pattern 9041 in FIG. 6) on the substrate 50, and there is a second overlapping area between the orthographic projection of the first conductive connection portion 9091 on the substrate 50 and the first auxiliary signal line layer 801, the first conductive connection portion 9091 is coupled to the initialization signal line pattern 904 in the first overlapping area, and the first conductive connection portion 9091 is coupled to the first auxiliary signal line layer 801 in the second overlapping area.

Specifically, the first conductive connection portion layer can be made of the first source-drain metal layer in the display panel, and the specific structure of the first conductive connection portion 9091 included in the conductive connection portion layer can be set according to actual needs, it only needs to satisfy that there is the first overlapping area between the orthographic projection of the first conductive connection portion 9091 on the substrate 50 and the orthographic projection of the initialization signal line pattern 904 on the substrate 50, and there is the second overlapping area between the orthographic projection of the first conductive connection portion 9091 on the substrate 50 and the first auxiliary signal line layer 801.

As shown in FIG. 3 and FIG. 6, exemplarily, the first conductive connection portion 9091 and the initialization signal line pattern 904 are coupled through the first via hole 61 located in the first overlapping area, and the first conductive connecting portion 9091 is coupled to the first auxiliary signal line layer 801 through the second via hole 62 located in the second overlapping area. It should be noted that, FIG. 6 shows the first gate insulating layer GI1, the second gate insulating layer GI2, the interlayer insulating layer ILD and the planarization layer PLN.

In the display panel provided by the above-mentioned embodiment, the coupling between the initialization signal line pattern 904 and the first auxiliary signal line layer 801 is realized by arranging the first conductive connection portion 9091, thereby avoiding forming a deep via hole between the initialization signal line pattern 904 and the first auxiliary signal line layer 801, which greatly improves the reliability of the coupling between the initialization signal line pattern 904 and the first auxiliary signal line layer 801. Moreover, this arrangement allows more layout methods for the initialization signal line pattern 904 and the first auxiliary signal line layer 801, which reduces the layout difficulty and manufacturing process difficulty of the display panel.

In the display panel provided by the above-mentioned embodiment, it is necessary to form a via hole in the planarization layer PLN, so that all the initialization signal line patterns 904 in the sub-pixel areas can be coupled together, so that two via holes penetrating through the planarization layer PLN need to be arranged in each sub-pixel area in the display panel, one of the two via holes is used for connecting the anode pattern arranged on the planarization layer PLN, and the other via hole is used for connecting the first auxiliary signal line layer 801 arranged on the planarization layer PLN. The planarization layer PLN is an organic layer with a thickness of about 2 μm. The diameter of the via hole formed on the planarization layer must be at least 4 μm. Otherwise, when forming the via hole by development, there is a risk of incomplete development, resulting in contact defect at the via hole.

With the continuous increasing of the pixel resolution of the display panel, the layout area that can be used by the sub-pixel driving circuit in the display panel is getting smaller and smaller, which makes it impossible to form two via holes penetrating the planarization layer PLN in each sub-pixel area. Therefore, the display panel provided by the above embodiment cannot meet the display requirement of high resolution.

Figure 8:
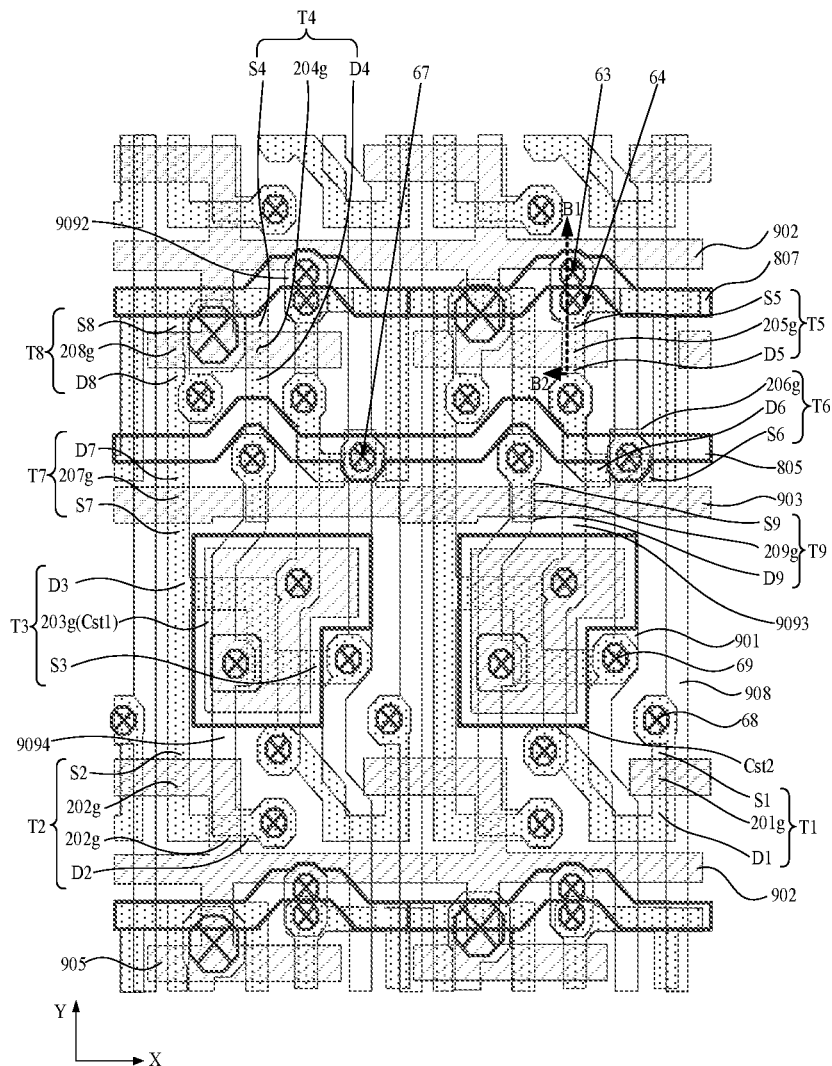
FIG. 8 is a schematic diagram of a second layout of two sub-pixel areas in a display panel according to an embodiment of the present disclosure.
Figure 9:
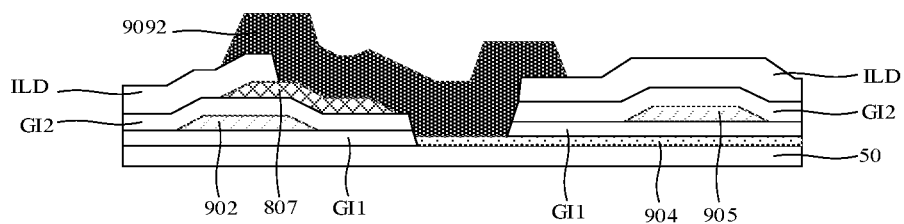
FIG. 9 is a schematic cross-sectional view along the B1B2 direction in FIG. 8.
Figure 11:
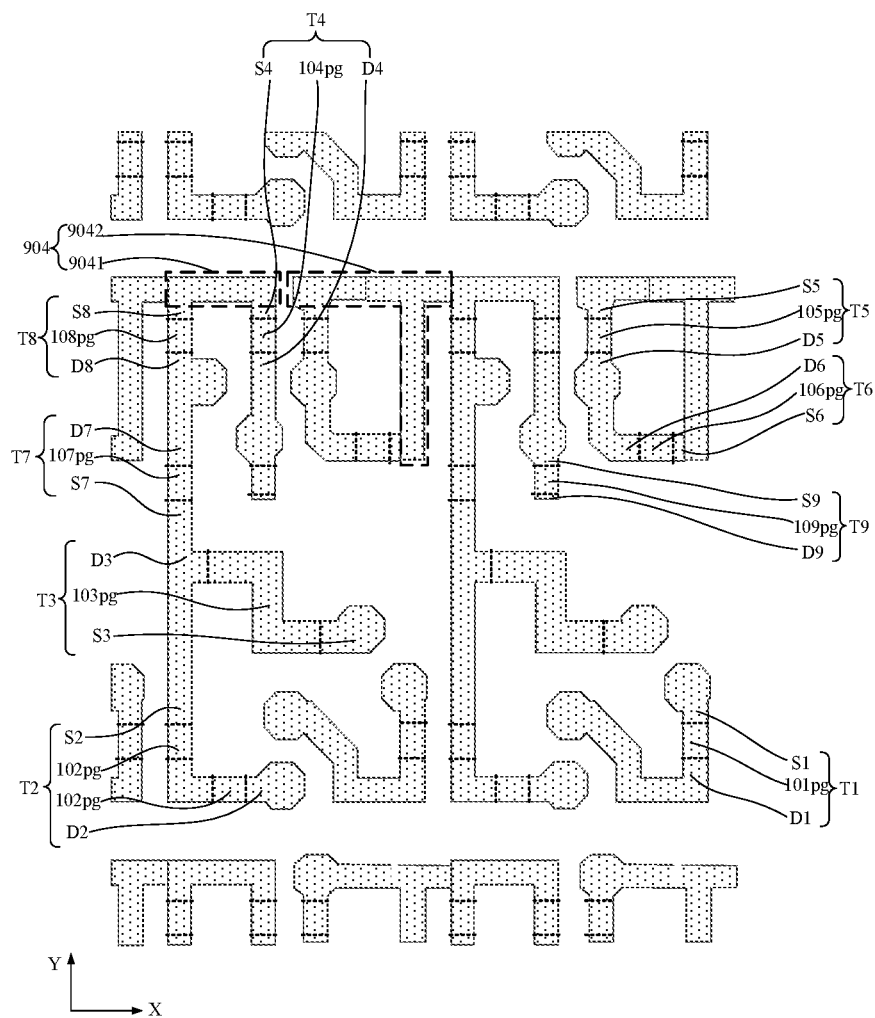
FIG. 11 is a schematic diagram of the layout of the active layer in FIG. 8.
Figure 15:
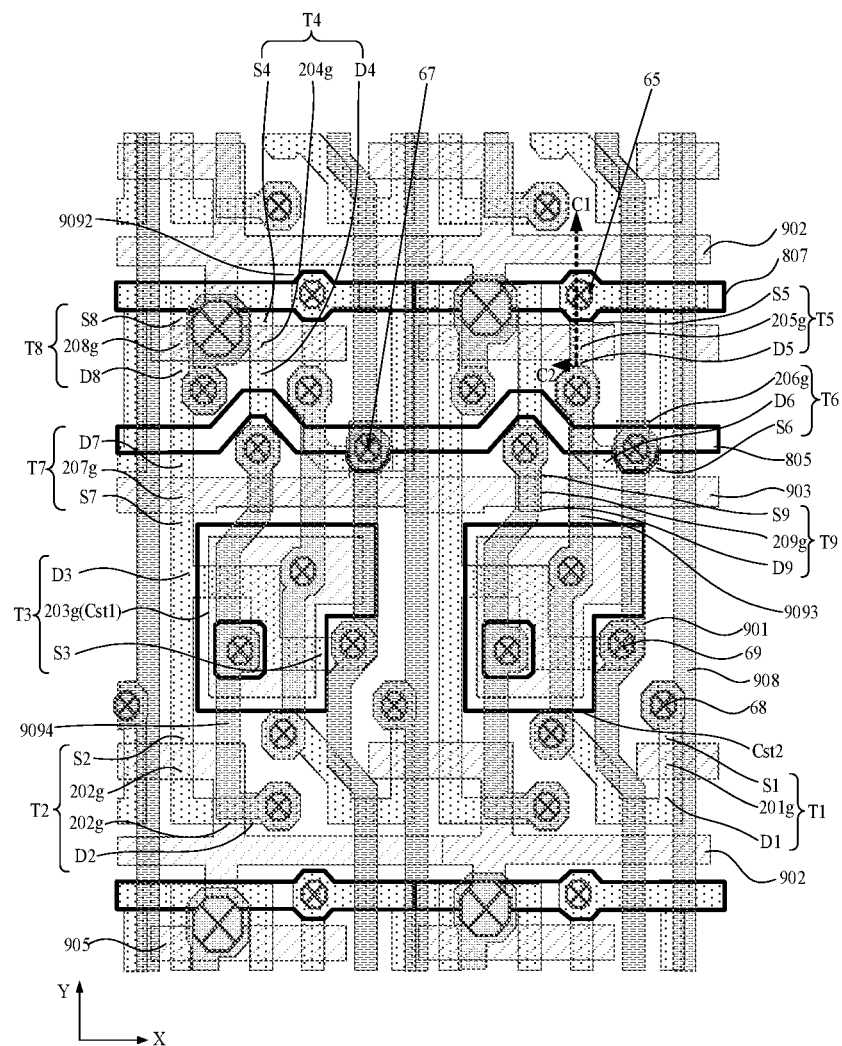
FIG. 15 is a schematic diagram of a third layout of two sub-pixel areas in a display panel according to an embodiment of the present disclosure.
Figure 17:
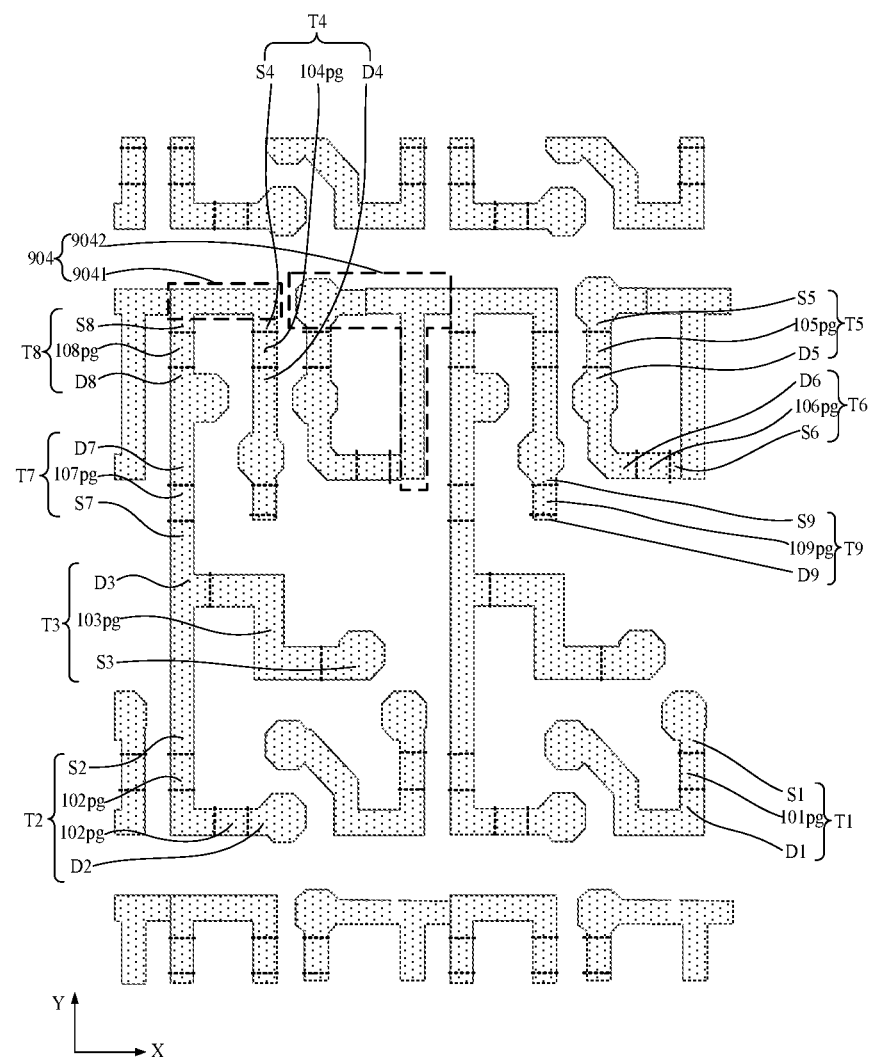
FIG. 17 is a schematic diagram of the layout of the active layer in FIG. 15.

Referring to FIG. 8 and FIG. 15, an embodiment of the present disclosure provides a display panel, including: a substrate, and an initialization signal line layer and a first auxiliary signal line layer that are sequentially stacked on the substrate along a direction away from the substrate; also includes a plurality of sub-pixel areas arranged in an array, the plurality of sub-pixel areas form a plurality of rows of sub-pixel areas arranged in sequence along the second direction, and each row of sub-pixel areas includes a plurality of sub-pixel areas arranged in the first direction, the first direction intersects the second direction;

As shown in FIG. 11 and FIG. 17, the initialization signal line layer includes an initialization signal line pattern 904 arranged in each of the sub-pixel areas;

As shown in FIG. 8 and FIG. 15, the first auxiliary signal line layer includes a plurality of first auxiliary signal line patterns 807 corresponding to the plurality of sub-pixel areas in a one-to-one manner, and the first auxiliary signal line pattern 807 is coupled to the initialization signal line pattern 904 in corresponding the sub-pixel area; at least part of the first auxiliary signal line pattern 807 extends along the first direction, in the same row of sub-pixel areas, first auxiliary signal line patterns 807 corresponding to the sub-pixel areas are coupled in sequence.

Specifically, the plurality of sub-pixel areas arranged in the array can be divided into multiple rows of sub-pixel areas sequentially arranged along the second direction, and multiple columns of sub-pixel areas sequentially arranged along the first direction. Each row of sub-pixel areas includes a plurality of sub-pixel areas arranged in sequence along the first direction, and each column of sub-pixel areas includes a plurality of sub-pixel areas arranged in sequence along the second direction. The first direction intersects the second direction. Exemplarily, the first direction includes the X direction, and the second direction includes the Y direction.

The initialization signal line layer includes a plurality of initialization signal line patterns 904, the plurality of initialization signal line patterns 904 correspond to the plurality of sub-pixel areas in a one-to-one manner, and the initialization signal line pattern 904 is located in the corresponding sub-pixel area, and is used to provide an initialization signal for the sub-pixel driving circuit corresponding to the sub-pixel area.

The display panel further includes a first auxiliary signal line layer, and the first auxiliary signal line layer is located on a side of the initialization signal line layer away from the substrate. Exemplarily, the initialization signal line layer is made by using the active layer in the display panel, and the first auxiliary signal line layer is made by using the second gate metal layer in the display panel.

The first auxiliary signal line layer includes a plurality of first auxiliary signal line patterns 807 corresponding to the plurality of sub-pixel areas in a one-to-one manner, and at least part of each first auxiliary signal line pattern 807 extends along the first direction, each first auxiliary signal line pattern 807 can be coupled to the initialization signal line pattern 904 in the corresponding sub-pixel area. It should be noted that the specific coupling manner of the first auxiliary signal line pattern 807 and the initialization signal line pattern 904 may include direct coupling and indirect coupling.

Along the first direction, in the same row of sub-pixel areas, the first auxiliary signal line patterns 807 corresponding to the sub-pixel areas are sequentially coupled. Exemplarily, along the first direction, in the same row of sub-pixel areas, the first auxiliary signal line patterns 807 corresponding to the sub-pixel areas form an integral structure.

According to the specific structure of the above-mentioned display panel, in the display panel provided by the embodiment of the present disclosure, the first auxiliary signal line layer is arranged on the side of the initialization signal line layer away from the substrate, and the first auxiliary signal line pattern 807 in the first auxiliary signal line layer can be coupled to the initialization signal line pattern 904 in the corresponding sub-pixel area, and in the same row of sub-pixel areas, the first auxiliary signal line patterns 807 corresponding to the sub-pixel areas are coupled in sequence; so that in the display panel, initialization signal line patterns 904 located in the same row of sub-pixel areas can be coupled together through the corresponding first auxiliary signal line pattern 807. It can be seen that in the display panel provided by the embodiment of the present disclosure, it is not necessary to use the spacing area between the anode patterns to form a mesh connection between the initialization signal line patterns 904 in the sub-pixel areas of the display panel, that is, it is not necessary to form two via holes penetrating the planarization player PLN in each sub-pixel area. Therefore, the display panel provided by the embodiments of the present disclosure effectively reduces the layout space required for each pixel area while realizing the coupling of the initialization signal line patterns 904 in the same row of sub-pixel areas, which is more beneficial to high-resolution development needs of display panels. It should be noted that the display panel provided by the embodiments of the present disclosure can achieve 530 PPI (Pixels Per Inch, Pixel Density).

Figure 10:
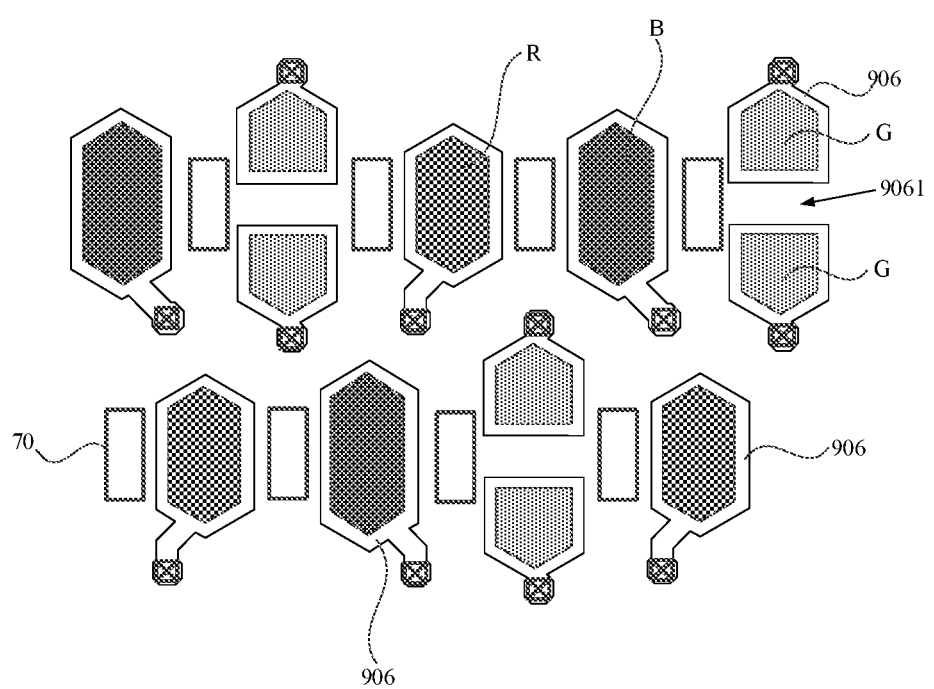
FIG. 10 is a schematic diagram of a layout of an anode layer provided by an embodiment of the present disclosure.

In addition, as shown in FIG. 10, in the display panel provided by the embodiment of the present disclosure, the first auxiliary signal line pattern 807 does not need to occupy the anode spacing area, so that the layout space used by the anode pattern in the display panel is larger, Therefore, it is more beneficial to reduce the layout difficulty of the anode pattern and the pixel defining layer in the display panel, so that the orthographic projection of the boundary where the pixel opening is formed in the pixel defining layer on the substrate can be located within the orthographic projection of the corresponding anode pattern on the substrate.

As shown in FIG. 8, FIG. 9, FIG. 11 to FIG. 14, in some embodiments, the display panel further includes:

A conductive connection portion layer located on a side of the first auxiliary signal line layer away from the substrate, the conductive connection portion layer includes second conductive connection portions 9092 corresponding to the plurality of sub-pixel areas in a one-to-one manner; in the same sub-pixel area, there is a first overlapping area between the orthographic projection of the second conductive connection portion 9092 on the substrate and the orthographic projection of the initialization signal line pattern 904 on the substrate, and there is a second overlapping area between the orthographic projection of the second conductive connection portion 9092 on the substrate and the first auxiliary signal line pattern 807; the second conductive connection portion 9092 is coupled to the initialization signal line pattern 904 in the first overlapping area, and the second conductive connection portion 9092 is coupled to the first auxiliary signal line pattern 807 in the second overlapping area.

Specifically, the conductive connection portion layer can be made of the first source-drain metal layer in the display panel, and the specific structure of the second conductive connection portion 9092 included in the conductive connection portion layer can be set according to actual needs. It only needs to satisfy that there is the first overlapping area between the orthographic projection of the second conductive connection portion 9092 on the substrate and the orthographic projection of the initialization signal line pattern 904 on the substrate, and there is a second overlapping area between the orthographic projection of the second conductive connection portion 9092 on the substrate and the first auxiliary signal line pattern 807.

As shown in FIG. 8, exemplarily, the second conductive connection portion 9092 is coupled to the initialization signal line pattern 904 through a via hole 64 located in the first overlapping area, and the second conductive connection portion 9092 is coupled to the first auxiliary signal line pattern 807 through a via hole 63 located in the second overlapping area.

In the display panel provided by the above embodiment, the coupling between the initialization signal line pattern 904 and the first auxiliary signal line pattern 807 is realized by arranging the second conductive connection portion 9092, so that the via hole for connecting the second conductive connection portion 9092 and the initialization signal line pattern 904 and the via hole 63 for connecting the second conductive connection portion 9092 and the first auxiliary signal line pattern 807 can be formed at the same time by the via hole etching process applied on the ILD layer in the display panel, so as to avoid introducing an additional via hole etching process between the first auxiliary signal line pattern 807 and the initialization signal line pattern 904. Therefore, the display panel provided by the embodiments of the present disclosure simplifies the manufacturing process and reduces the manufacturing cost.

In addition, the above method enables more layout methods between the initialization signal line pattern 904 and the first auxiliary signal line pattern 807, which reduces the layout difficulty and manufacturing process difficulty of the display panel.

As shown in FIG. 8 and FIG. 11, in some embodiments, each of the initialization signal line patterns 904 includes a first sub-pattern 9041 and a second sub-pattern 9042, and in adjacent sub-pixel areas in the same row along the first direction, the second sub-pattern 9042 in the previous sub-pixel area and the first sub-pattern 9041 in the current sub-pixel area form an integral structure; in each sub-pixel area, the second sub-pattern 9042 is coupled to the first auxiliary signal line pattern 807.

Specifically, the specific structures of the initialization signal line patterns 904 are various. Exemplarily, each of the initialization signal line patterns 904 includes a first sub-pattern 9041 and a second sub-pattern 9042, in the same sub-pixel area, the first sub-pattern 9041 and the second sub-pattern 9042 are arranged along the first direction. When the initialization signal line pattern 904 adopts this structure, in adjacent sub-pixel areas, the second sub-pattern 9042 in the previous sub-pixel area and the first sub-pattern in the current sub-pixel area 9041 are adjacent.

In the above arrangement, in the adjacent sub-pixel areas in the same row along the first direction, and the second sub-pattern 9042 in the previous sub-pixel area and the first sub-pattern 9041 in the current sub-pixel area form an integral structure, which is not only conducive to improving the stability of the initialization signal transmitted on the initialization signal line pattern 904, but also effectively reducing the manufacturing difficulty of the initialization signal line pattern 904.

It should be noted that when the initialization signal line pattern 904 includes the first sub-pattern 9041 and the second sub-pattern 9042, exemplarily, the first sub-pattern 9041 and the second sub-pattern 9042 are respectively coupled to the first auxiliary signal line pattern 807, this connection method can better ensure the connection performance between the initialization signal line pattern 904 and the first auxiliary signal line pattern 807, and can more effectively improve the stability of the initialization signal transmitted on the initialization signal line pattern 904; or, as shown in FIG. 8, in each sub-pixel area, the second sub-pattern 9042 is coupled to the first auxiliary signal line pattern 807, that is as shown in FIG. 8, the second conductive connection portion 9092 and the second sub-pattern 9042 are coupled through the via hole 64 located in the first overlapping area, and the second conductive connection portion 9092 and the first auxiliary signal line pattern 807 are coupled through the via hole 63 located in the second overlapping area.

Figure 13:
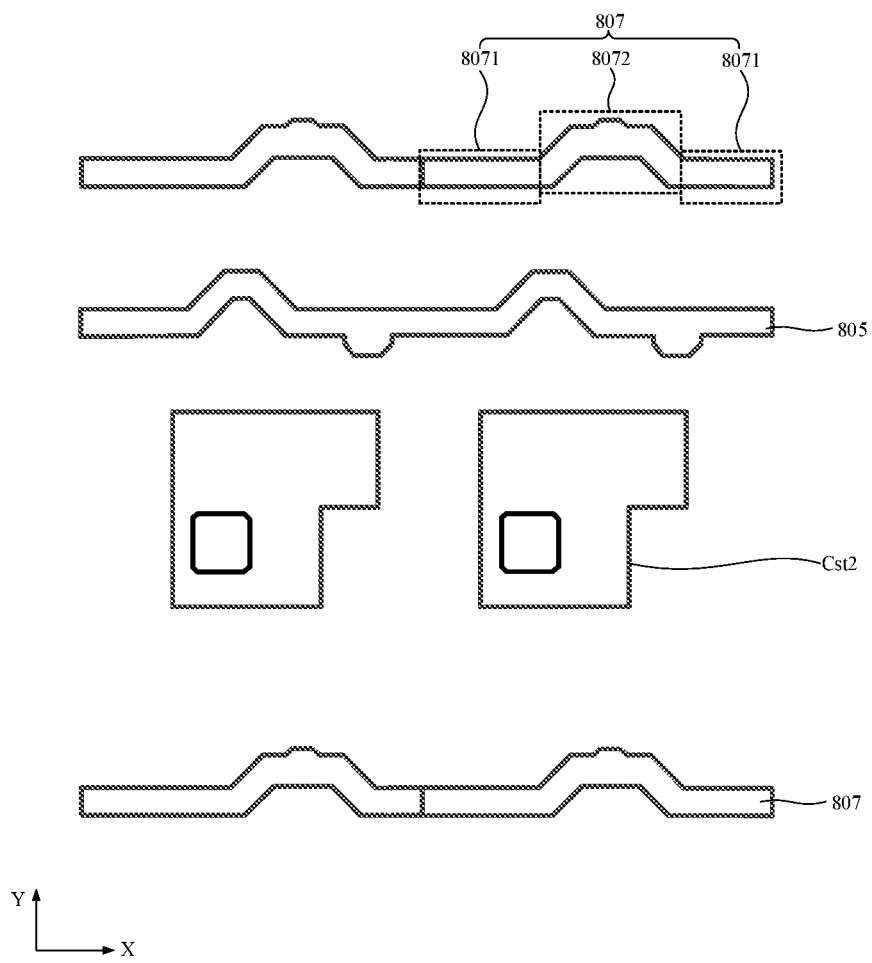
FIG. 13 is a schematic diagram of the layout of the second gate metal layer in FIG. 8.
Figure 14:
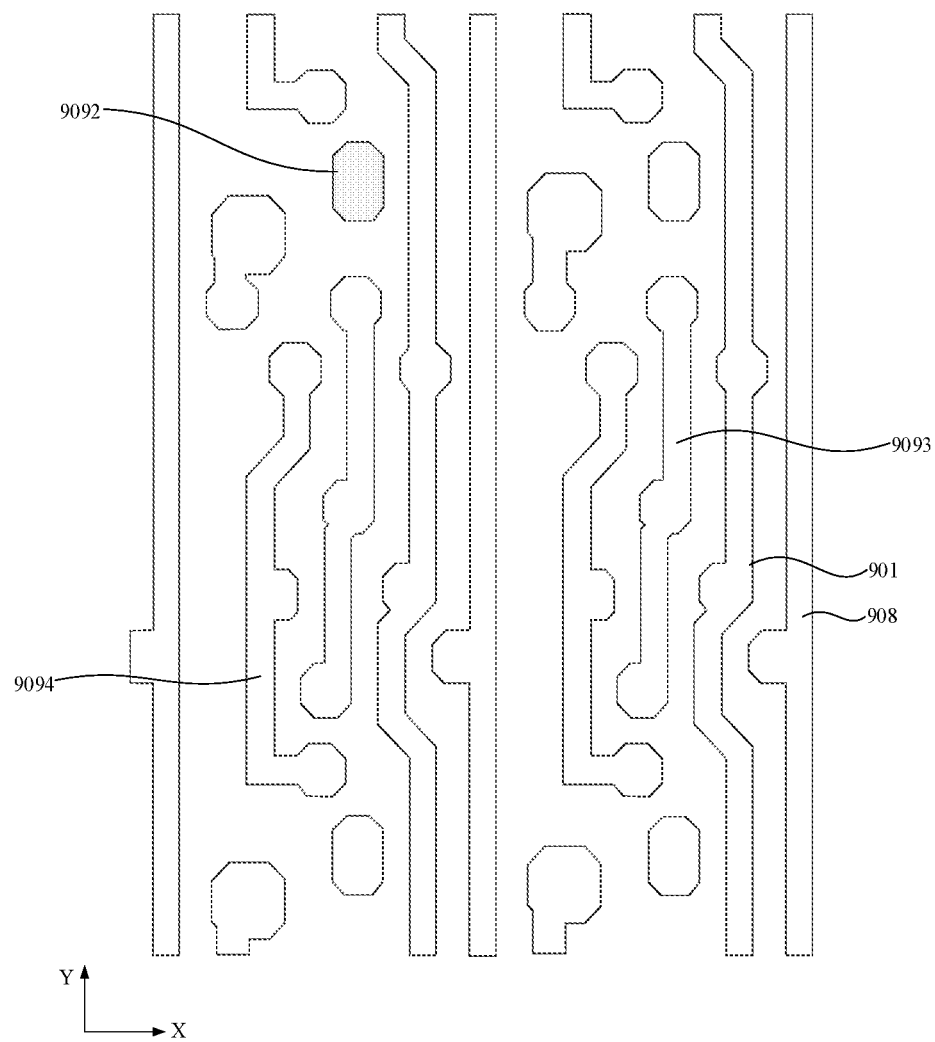
FIG. 14 is a schematic diagram of the layout of the first source-drain metal layer in FIG. 8.

As shown in FIG. 8 and FIG. 13, in some embodiments, the first auxiliary signal line pattern 807 includes a first portion 8071 and a second portion 8072 coupled to each other, and the first portion 8071 extends along the first direction, the second portion 8072 protrudes from the first portion 8071 along the direction perpendicular to the first direction; the orthographic projection of the first portion 8071 on the substrate overlaps the orthographic projection of the initialization signal line pattern 904 on the substrate overlap, and the orthographic projection of the second portion 8072 on the substrate does not overlap the orthographic projection of the initialization signal line pattern 904 on the substrate; in the same sub-pixel area, there is the second overlapping area between the orthographic projection of the second portion 8072 on the substrate and the orthographic projection of the second conductive connection portion 9092 on the substrate.

Specifically, the specific structure of the first auxiliary signal line pattern 807 is various. Exemplarily, the first auxiliary signal line pattern 807 includes a first portion 8071 and a second portion 8072 coupled to each other, and the first portion 8071 extends along the first direction, and the second portion 8072 is formed in an arch-like structure. Exemplarily, along a direction perpendicular to the first direction, the second portion 8072 protrudes from the first portion 8071 in a direction away from the driving transistor (e.g., the third transistor T3) in the corresponding sub-pixel area.

In the same sub-pixel area, there is the second overlapping area between the orthographic projection of the second portion 8072 on the substrate and the orthographic projection of the second conductive connection portion 9092 on the substrate, there is the first overlapping area between the orthographic projection of the second conductive connection portion 9092 on the substrate and the orthographic projection of the initialization signal line pattern 904 on the substrate, which is more conducive to the layout of the second conductive connection portion 9092, and is more conducive to the formation of the via hole 63 and the via hole 64.

As shown in FIGS. 15-19, in some embodiments, there is a third overlapping area between the orthographic projection of the first auxiliary signal line pattern 807 on the substrate and the orthographic projection of the initialization signal line pattern 904 on the substrate. The first auxiliary signal line pattern 807 is directly coupled to the initialization signal line pattern 904 through a via hole located in the third overlapping area.

Specifically, there is a third overlapping area between the orthographic projection of the first auxiliary signal line pattern 807 on the substrate and the orthographic projection of the initialization signal line pattern 904 on the substrate, and a via hole 65 is formed in the third overlapping area, so that the first auxiliary signal line pattern 807 can be directly coupled to the initialization signal line pattern 904 through the via hole 65.

Figure 16:
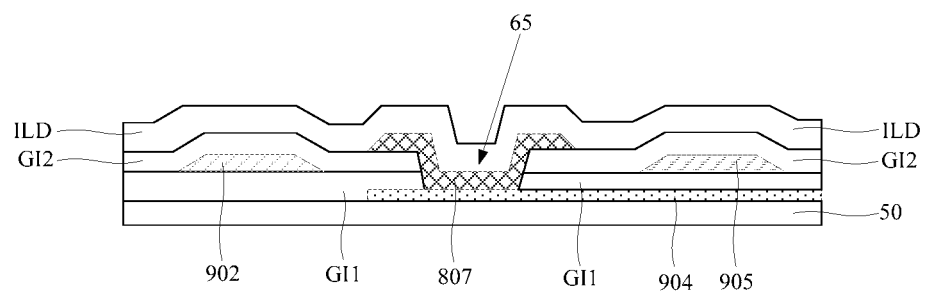
FIG. 16 is a schematic cross-sectional view along the C1C2 direction in FIG. 15.

It should be noted that, as shown in FIG. 16, the via hole 65 penetrates the first gate insulating layer GI1 and the second gate insulating layer located between the initialization signal line pattern 904 and the first auxiliary signal line pattern 807.

It is worth noting that when the second conductive connection portion 9092 is formed in the display panel, a double-connection hole design including the via hole 63 and the via hole 64 needs to be introduced into the display panel. The second conductive connection part 9092 is generally made of the source-drain metal layer in the display panel, the via hole 63 is used to expose the first auxiliary signal line pattern 807, the via hole 64 is used to expose the initialization signal line pattern 904, the second conductive connection portion 9092 is coupled to the first auxiliary signal line pattern 807 and the initialization signal line pattern 904 through the via hole 63 and the via hole 64, respectively. As shown in FIG. 8, since the double-connection hole design requires a large space and will extend to the gate line pattern 902, a layer below the opening area of the double-connection hole is not flat, and uneven etching may be occur during etching the double-connection hole and it is difficult to control the size of the openings, thereby resulting in poor process.

In the display panel provided by the above-mentioned embodiment, the first auxiliary signal line pattern 807 is directly coupled to the initialization signal line pattern 904 through the via hole located in the third overlapping area, so as to avoid introducing the double-connection hole design and the second conductive connection portion 9092, this arrangement requires less space, so that the available layout space of the first auxiliary signal line pattern 807 is larger, which can not only reduce the possibility of poor process, but also avoid unnecessary overlap with other signal line graphics, and avoid some unknown design risk.

Figure 18:
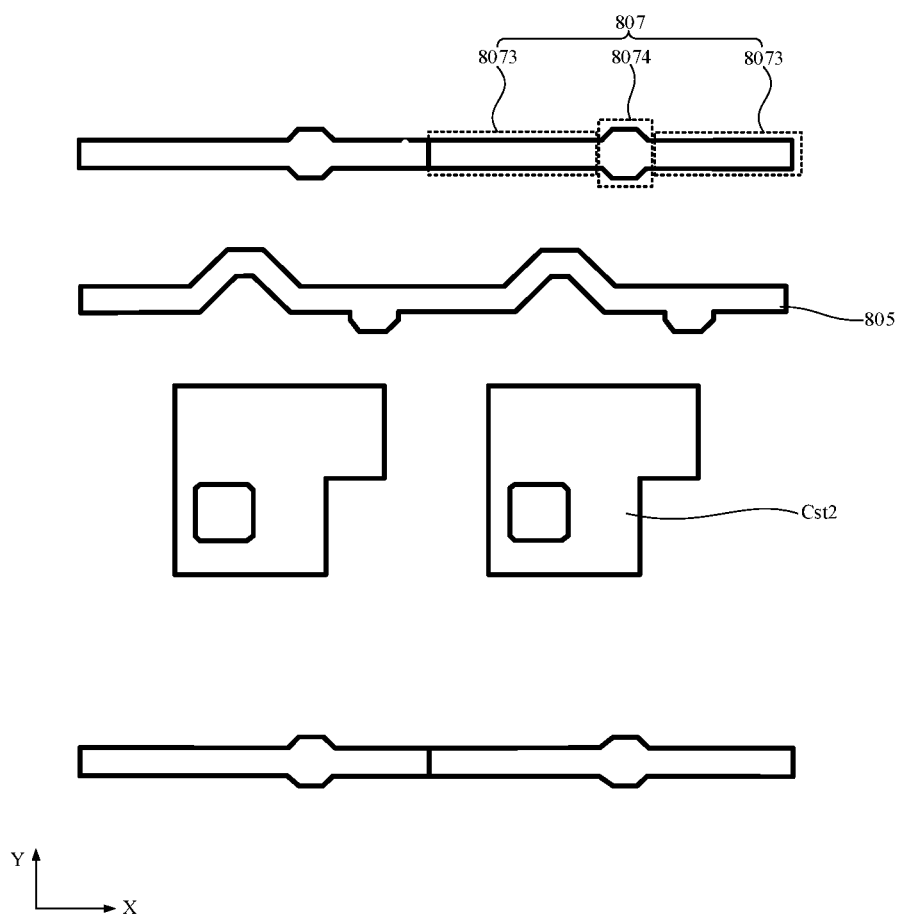
FIG. 18 is a schematic diagram of the layout of the second gate metal layer in FIG. 15.

As shown in FIG. 18, in some embodiments, the first auxiliary signal line pattern 807 includes a third portion 8073 and a fourth portion 8074, the third portion 8073 extends along the first direction, in a direction perpendicular to the first direction, the width of the fourth portion 8074 is greater than the width of the third portion 8073; there is a third overlapping area between the orthographic projection of the fourth portion 8074 on the substrate and the orthographic projection of the initialization signal line pattern 904 on the substrate.

Specifically, when the first auxiliary signal line pattern 807 is directly coupled to the initialization signal line pattern 904, the specific structure of the first auxiliary signal line pattern 807 is various. The first auxiliary signal line pattern 807 includes a third portion 8073 and a fourth portion 8074 coupled to each other, the third portion 8073 extends along the first direction, and in a direction perpendicular to the first direction, the width of the fourth portion 8074 is greater than the width of the third portion 8073.

In the display panel provided by the above embodiment, there are the third overlapping area between the orthographic projection of the fourth portion 8074 on the substrate and the orthographic projection of the initialization signal line pattern 904 on the substrate, which is more beneficial to increase the area of the third overlapping area, and increase the diameter of the via hole 65, so that there is a better connection performance between the initialization signal line pattern 904 and the first auxiliary signal line pattern 807.

It should be noted that, in order to increase the area of the third overlapping area, the shape of the initialization signal line pattern 904 in the third overlapping area can also be adjusted accordingly. Exemplarily, as shown in FIG. 17, a width of a portion of the initialization signal line pattern 904 located in the third overlapping area in the direction perpendicular to the first direction can be set to be the same as the width of the fourth portion 8074. Exemplarily, the orthographic projection of the portion of the initialization signal line pattern 904 located in the third overlapping area on the substrate coincides with the orthographic projection of the fourth portion 8074 on the substrate.

Figure 20:
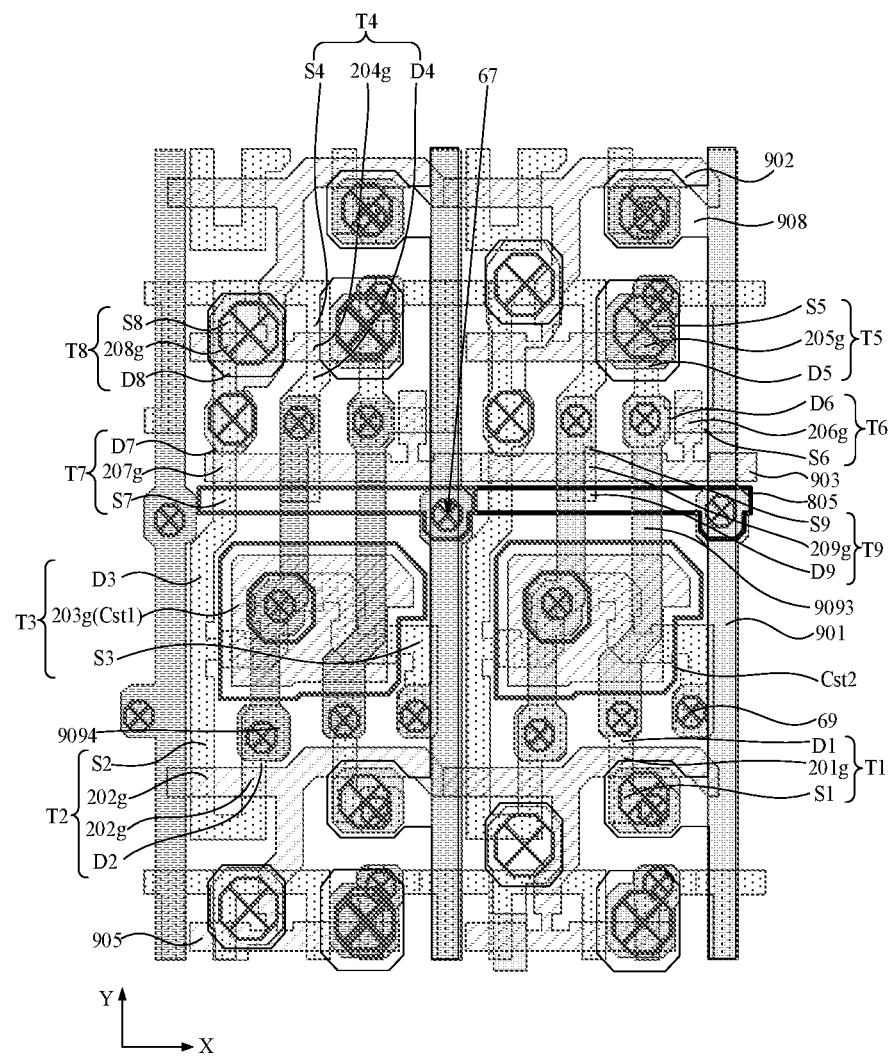
FIG. 20 is a schematic diagram of a fourth layout of two sub-pixel areas in a display panel according to an embodiment of the present disclosure.
Figure 21:
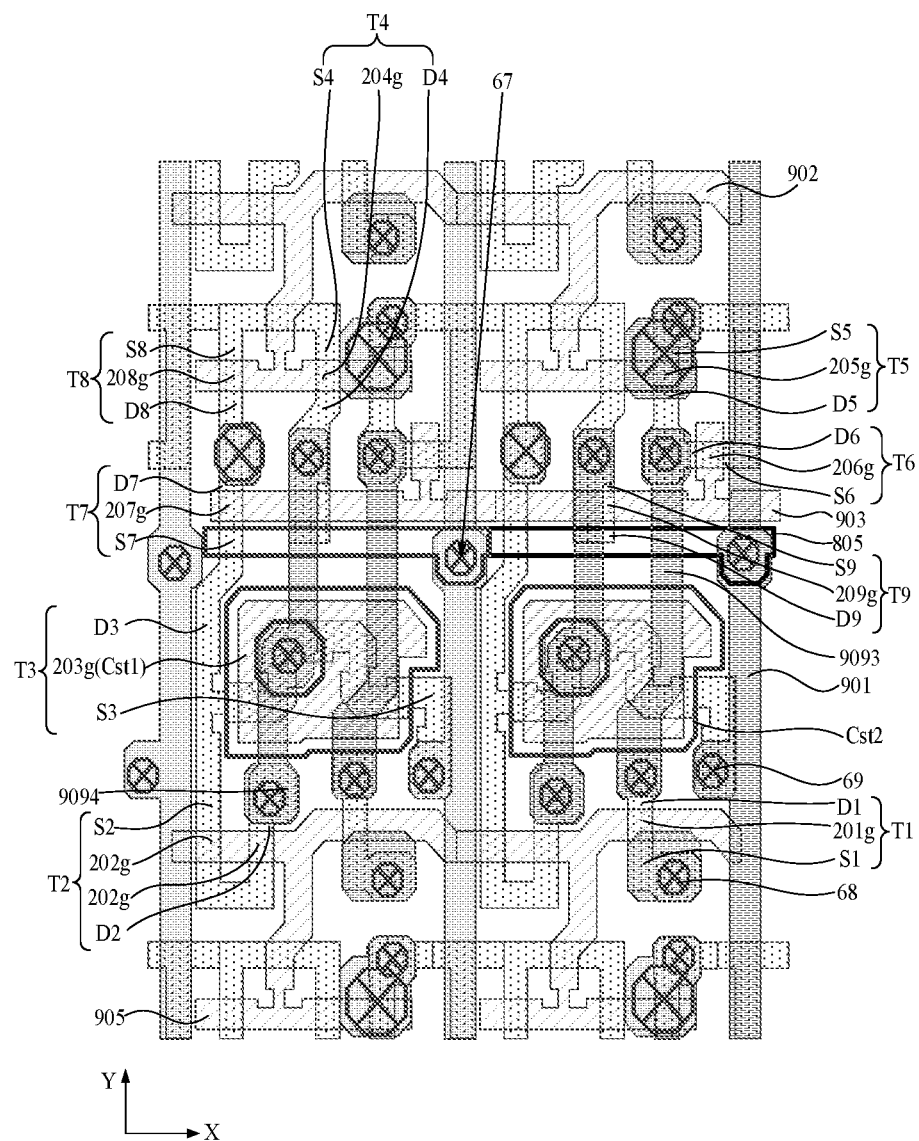
FIG. 21 is a schematic diagram of the layout of the second source-drain metal layer not included in FIG. 20.
Figure 22:
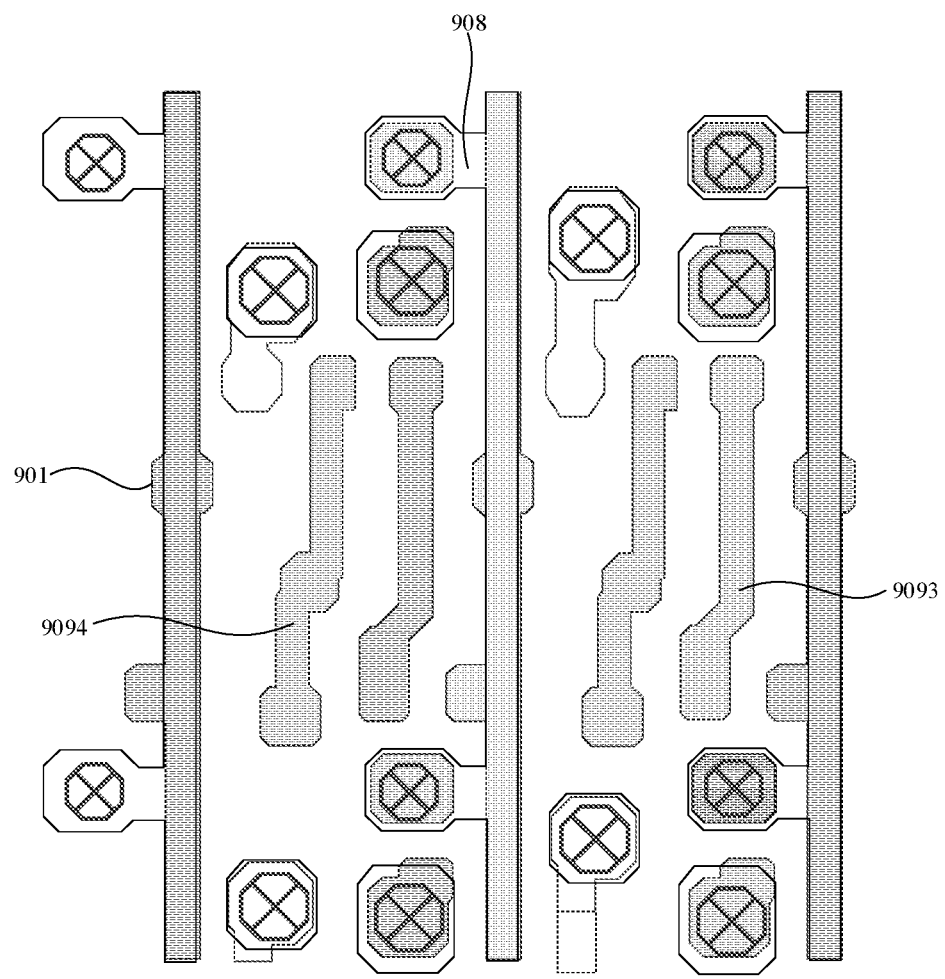
FIG. 22 is a schematic diagram of the layout of the first source-drain metal layer and the second source-drain metal layer in FIG. 20.

As shown in FIGS. 20 to 22, in some embodiments, the display panel further includes a power signal line layer and a data line layer that are sequentially stacked on the first auxiliary signal line layer along a direction away from the substrate;

The power signal line layer includes a power signal line pattern 901 located in each of the sub-pixel areas, and at least part of the power signal line pattern 901 extends along the second direction;

The data line layer includes a data line pattern 908 located in each of the sub-pixel areas, and at least part of the data line pattern 908 extends along the second direction;

In the same sub-pixel area, the orthographic projection of the power signal line pattern 901 on the substrate overlaps the orthographic projection of the data line pattern 908 on the substrate.

Specifically, the power supply signal line layer includes power supply signal line patterns 901 arranged in each of the sub-pixel areas, the power supply signal line patterns 901 correspond to the sub-pixel areas in a one-to-one manner, and the power supply signal line pattern 901 is located in the corresponding sub-pixel area. At least part of the power signal line pattern 901 extends along the second direction, and the power signal line patterns 901 located in each column of sub-pixel areas are sequentially coupled along the second direction, and can form an integral structure. Exemplarily, the power signal line pattern 901 is made by using the first source-drain metal layer in the display panel.

The data line layer includes a plurality of data line patterns 908, the data line patterns 908 correspond to the plurality of sub-pixel areas in a one-to-one manner, and the data line pattern 908 is located in the corresponding sub-pixel area and is used for providing a data signal to the sub-pixel driving circuit corresponding to the sub-pixel area. At least part of each data line pattern 908 extends along the second direction, and the data line patterns 908 located in the same column of sub-pixel areas along the second direction are electrically connected in sequence to form an integral structure. Exemplarily, the data line pattern 908 is made by using the second source-drain metal layer in the display panel. It is worth noting that, as shown in FIG. 22, in addition to forming the data line pattern 908, the second source-drain metal layer in the display panel can also form some conductive connecting portions, and these conductive connecting portions can be used to connect function patterns arranged at different layers, and used to connect the function patterns arranged at the same layer.

In the same sub-pixel area, the orthographic projection of the power signal line pattern 901 on the substrate overlaps the orthographic projection of the data line pattern 908 on the substrate, which enables the power signal line pattern 901 to play a good shielding effect on the data line pattern 908, effectively improves the problem of static crosstalk. Moreover, compared with the conventional solution, the power signal line pattern 901 and the data line pattern 908 are arranged side by side on the same layer, the layout space of the sub-pixels can be effectively saved, which is more conducive to the high resolution development of the display panel. It is worth noting that the display panel can achieve 538 PPI when the above-mentioned arrangement method is adopted.

Figure 23:
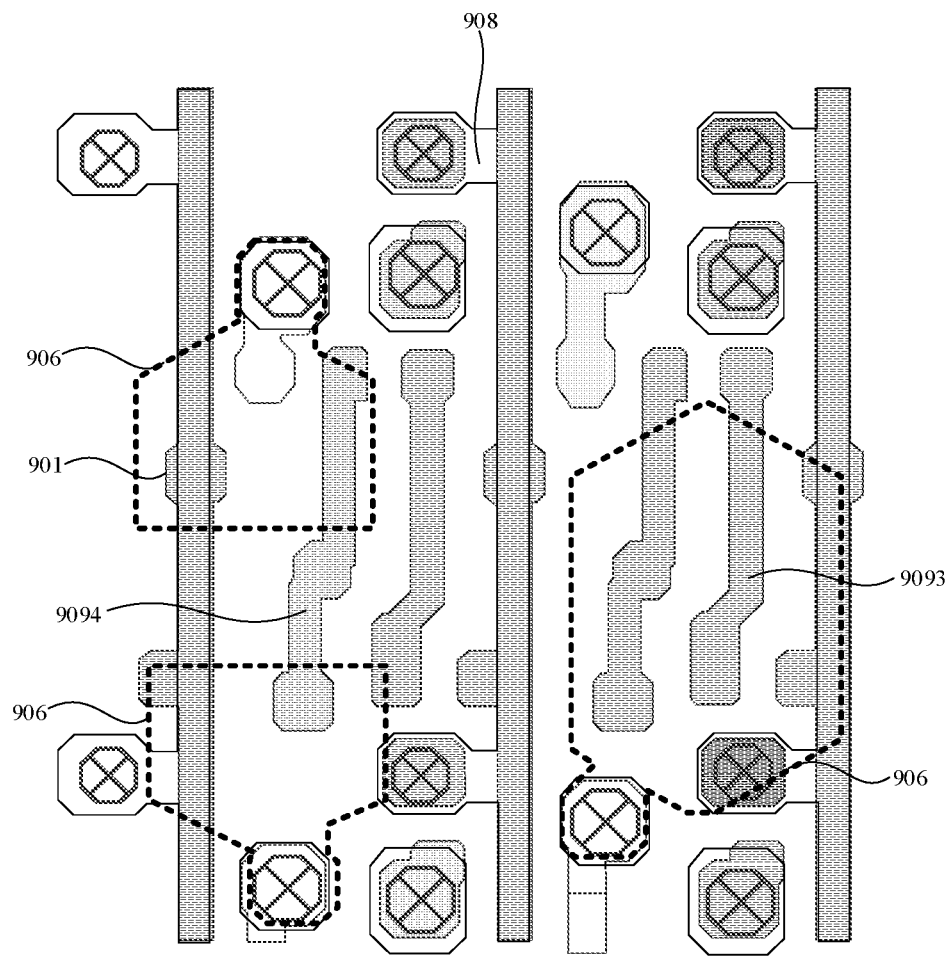
FIG. 23 is a schematic diagram of the layout of the anode layer in FIG. 22.

It is worth noting that FIG. 23 shows a schematic diagram of the layout of the first source-drain metal layer, the second source-drain metal layer and the anode layer in the above embodiment, and FIG. 23 shows the anode patterns corresponding to two green sub-pixels and one anode pattern corresponding to one blue sub-pixel.

As shown in FIG. 8, FIG. 13, FIG. 15 and FIG. 18, in some embodiments, the display panel further includes:

A power supply signal line layer located on a side of the initialization signal line layer away from the substrate, the power supply signal line layer includes a power supply signal line pattern 901 arranged in each of the sub-pixel areas, at least part of the power supply signal line pattern 901 extends in the second direction;

a third auxiliary signal line layer located between the initialization signal line layer and the power supply signal line layer, the third auxiliary signal line layer includes a third auxiliary signal line pattern 805 located in each of the sub-pixel areas, at least part of the third auxiliary signal line pattern 805 extends along the first direction; in the same sub-pixel area, there is a fourth overlapping area between the orthographic projection of the third auxiliary signal line pattern 805 on the substrate and the orthographic projection of the power signal line pattern 901 on the substrate, and the third auxiliary signal line pattern 805 is coupled to the power signal line pattern 901 in the fourth overlapping area; the third auxiliary signal line patterns 805 in the same row of sub-pixel areas are sequentially coupled.

Specifically, the power signal line layer is located on the side of the initialization signal line layer away from the substrate, and the power signal line layer includes a power signal line pattern 901 arranged in each of the sub-pixel areas. The power signal line patterns 901 correspond to the sub-pixel areas in a one-to-one manner, and the power signal line pattern 901 are located in the corresponding sub-pixel area. At least part of the power signal line pattern 901 extends along the second direction, and the power signal line patterns 901 arranged in each column of sub-pixel areas are sequentially coupled along the second direction, and can form an integral structure.

The third auxiliary signal line patterns 805 correspond to the sub-pixel areas in a one-to-one manner, the third auxiliary signal line pattern 805 is located in the corresponding sub-pixel area, and at least part of the third auxiliary signal line pattern 805 extends along the first direction, the third auxiliary signal line patterns 805 located in the same row of sub-pixel areas along the first direction are coupled in sequence, exemplarily, the third auxiliary signal line patterns 805 located in the same row of sub-pixel areas along the first direction are formed as an integral structure.

At least part of the power signal line pattern 901 extends along a second direction, and the second direction intersects with the first direction, so in the same sub-pixel area, a fourth overlapping area is between the orthographic projection of the third auxiliary signal line pattern 805 on the substrate and the orthographic projection of the power signal line pattern 901 on the substrate, and the third auxiliary signal line pattern 805 is coupled to the power signal line pattern 901 through a via hole arranged in the fourth overlapping area 67.

In the display panel provided by the above embodiment, the power signal line patterns 901 located in the same column of sub-pixel areas along the second direction are sequentially coupled, and the third auxiliary signal line patterns 805 located in the same row of sub-pixel areas along the first direction are sequentially coupled, and the third auxiliary signal line pattern 805 and the power supply signal line pattern 901 are coupled in the same sub-pixel, so that the power supply signal line layer and the third auxiliary signal line layer together form a grid structure with crossing wirings. This arrangement effectively improves the stability of the power signal line layer, and the power signal transmitted on the power signal line layer is used to provide the source electrode of the driving transistor in the sub-pixel driving circuit, while the light-emitting current generated by the sub-pixel driving circuit is $I_{oled}=k[(Vgs-Vth)]^2$, $Vgs=Vg-Vs$, Vg is the gate voltage of the driving transistor, Vs is the source voltage of the driving transistor, and Vth is the threshold voltage of the driving transistor, so that the power signal of Vs will have an impact on the value of the light-emitting current $I_{oled}$. Therefore, the above method can improve the stability of the power signal line layer, and at the same time, ensure the stability of the light-emitting current $L_{oled}$, and effectively avoid dynamic crosstalk phenomenon.

As shown in FIG. 8 and FIG. 15, in some embodiments, the display panel further includes:

a light-emitting control signal line layer, the light-emitting control signal line layer includes a light-emitting control signal line pattern 903 located in each of the sub-pixel areas, and at least part of the light-emitting control signal line pattern 903 extends along the first direction;

a reset signal line layer, the reset signal line layer includes a reset signal line pattern 905 located in each of the sub-pixel areas, and the reset signal line pattern 905 extends along the first direction;

In the same sub-pixel area, the orthographic projection of the third auxiliary signal line pattern 805 on the substrate is located between the orthographic projection of the light-emitting control signal line pattern 903 on the substrate and the orthographic projection of the reset signal line pattern 905 the on the substrate, the third auxiliary signal line pattern 805 is formed in a wavy structure.

Specifically, the light-emitting control signal line layer includes light-emitting control signal line patterns 903 corresponding to the sub-pixel areas in a one-to-one manner, the light-emitting control signal line pattern 903 is located in the corresponding sub-pixel area, and at least part of the light-emitting control signal line pattern 903 extends along the first direction, and the light-emitting control signal line patterns 903 located in the same row of sub-pixel areas are electrically connected in sequence to form an integral structure.

The reset signal line layer includes reset signal line patterns 905 corresponding to the sub-pixel areas in a one-to-one manner, the reset signal line pattern 905 is located in the corresponding sub-pixel area, and the reset signal line pattern 905 extends along the first direction.

In the display panel provided by the above embodiment, in the same sub-pixel area, the orthographic projection of the third auxiliary signal line pattern 805 on the substrate is located between the orthographic projection of the light-emitting control signal line pattern 903 on the substrate and the orthographic projection of the reset signal line pattern 905 on the substrate, and the third auxiliary signal line pattern 805 is formed into a wavy structure; even if the third auxiliary signal line patterns 805 in the same row of sub-pixel areas along the first direction are coupled in sequence, the third auxiliary signal line pattern 805 needs to occupy a large horizontal layout space, the third auxiliary signal line pattern 805 will not overlap the light-emitting control signal line pattern 903, thereby avoiding increasing the resistance-capacitance (RC) loading of the light-emitting control signal line patterns 903 and increasing the power consumption of the gate driving circuit in the display panel.

Moreover, when both the third auxiliary signal line pattern 805 and the second electrode plate Cst2 of the storage capacitor Cst are made of the second gate metal layer, the above arrangement does not require reducing the area of the second electrode plate Cst2 of the storage capacitor Cst to meet the layout space requirements of the third auxiliary signal line pattern 805, so that the area of the second electrode plate Cst2 of the storage capacitor Cst is large enough, which is more conducive to the maintenance of the gate signal of the driving transistor in the sub-pixel driving circuit, as well as the size and layout design of the driving transistor.

In addition, the above-mentioned third auxiliary signal line pattern 805 is formed into a wavy structure, so that the third auxiliary signal line pattern 805 can make good use of the layout space between the light-emitting control signal line pattern 903 and the reset signal line pattern 905, so as to not only solve the problem of dynamic crosstalk, but also facilitate the development of the display panel towards high resolution.

As shown in FIG. 13 and FIG. 18, in some embodiments, the display panel further includes a transistor structure and a storage capacitor Cst, and the storage capacitor Cst includes a first electrode plate Cst1 and a second electrode plate Cst2 disposed opposite to each other, the first electrode plate Cst1 is located between the substrate and the second electrode plate Cst2, and the first electrode plate Cst1 and the gate electrode of the transistor structure are arranged at the same layer and made of the same material; the first auxiliary signal line layer (including the first auxiliary signal line pattern 807) and/or the third auxiliary signal line layer (including the third auxiliary signal line pattern 805) are arranged at the same layer and made of the same material as the second electrode plate.

Specifically, the layout of film layers corresponding to the display panel is as follows: an active film layer, a first gate insulating layer, a first gate metal layer, a second gate insulating layer, a second gate metal layers, an interlayer insulating layer, a first source-drain metal layer, a second source-drain metal layer and a planarization layer that are arranged in sequence along a direction away from the substrate.

The sub-pixel driving circuit includes a storage capacitor Cst and a plurality of transistor structures, the active film layer is used to form active patterns in the plurality of transistor structures, and the first gate metal layer is used to form the gate electrodes of the plurality of transistor structures and the first electrode plate Cst1 of the storage capacitor Cst, and the second gate metal layer is used to form the second electrode plate Cst2 of the storage capacitor Cst.

In the above, the first electrode plate Cst1 and the gate electrode of the transistor structure are arranged at the same layer and made of the same material, so that the first electrode plate Cst1 and the gate electrode of the transistor structure can be formed simultaneously in the same patterning process, so as to simplify the production process of the display panel and save the production cost. Similarly, the first auxiliary signal line layer and/or the third auxiliary signal line layer and the second electrode plate Cst2 are arranged at the same layer and made of the same material, so that the first auxiliary signal line layer and/or the third auxiliary signal line layer and the second electrode plate Cst2 are formed simultaneously in the same patterning process, thereby simplifying the manufacturing process of the display panel and saving the production cost.

It should be noted that the above "same layer" refers to a layer structure formed by using the same film forming process to form a film layer for forming a specific pattern, and then using the same mask to form the layer structure through a single patterning process. Depending on the specific pattern, the single patterning process may include multiple times of exposure, development or etching processes, and the specific patterns in the formed layer structure may be continuous or discontinuous, and these specific patterns may also be at different heights or have different thicknesses.

As shown in FIG. 8, FIG. 12, FIG. 14, FIG. 15 and FIG. 19, in some embodiments, the display panel further includes:
- a gate line layer, the gate line layer includes a gate line pattern 902 located in each of the sub-pixel areas, and at least part of the gate line pattern 902 extends along the first direction;
- a data line layer, the data line layer includes a data line pattern 908 located in each of the sub-pixel areas, at least part of the data line pattern 908 extends along the second direction, and an orthographic projection of the data line pattern 908 on the substrate overlaps an orthographic projection of the gate line pattern 902 on the substrate;
- a conductive connection portion layer, the conductive connection portion layer includes a third conductive connection portion 9093 and a fourth conductive connection portion 9094 located in each of the sub-pixel areas;

Sub-pixel driving circuits corresponding to the sub-pixel areas in a one-to-one manner, each of the sub-pixel driving circuits includes: a driving transistor (i.e., a third transistor T3), a storage capacitor Cst, a first transistor T1 and a second transistor T2; a gate electrode of the driving transistor is multiplexed as the first electrode plate Cst1 of the storage capacitor Cst, and the gate electrode of the driving transistor is connected to the second electrode D2 of the second transistor T2 through the fourth conductive connection portion 9094 in the corresponding sub-pixel area, and the second electrode plate Cst2 of the storage capacitor Cst is coupled to the second electrode D1 of the first transistor T1 through the third conductive connection portion 9093 in the corresponding sub-pixel area; the gate electrode 201g of the first transistor T1 and the gate electrode 202g of the second transistor T2 are respectively coupled to the gate line pattern 902 in the corresponding sub-pixel area; the orthographic projection of the gate line pattern 902 on the substrate does not overlap the orthographic projection of the third conductive connection portion 9093 on the substrate, and/or the orthographic projection of the gate line pattern 902 on the substrate does not overlap the orthographic projection of the fourth conductive connection portion 9094 on the substrate.

Specifically, the gate line layer includes a plurality of gate line patterns 902, the gate line patterns 902 correspond to the plurality of sub-pixel areas in a one-to-one manner, and the gate line pattern 902 is located in the corresponding sub-pixel area, and is used for providing a scan signal to the sub-pixel driving circuit corresponding to the sub-pixel area. At least part of each of the gate line patterns 902 extends along the first direction, and the gate line patterns 902 located in the same row of sub-pixel areas along the first direction are electrically connected in sequence to form an integral structure.

The data line layer includes a plurality of data line patterns 908, the data line patterns 908 correspond to the plurality of sub-pixel areas in a one-to-one manner, and the data line pattern 908 is located in the corresponding sub-pixel area and is used for providing a data signal for the sub-pixel driving circuit corresponding to the sub-pixel area. At least part of each of the data line patterns 908 extends along the second direction, and the data line patterns 908 located in the same column of sub-pixel areas along the second direction are electrically connected in sequence to form an integral structure.

The conductive connection portion layer can be made of the first source-drain metal layer in the display panel, and the specific structures of the third conductive connection portion 9093 and the fourth conductive connection portion 9094 included in the conductive connection portion layer can be set based on actual conditions. For example, at least part of the third conductive connection portion 9093 extends along the second direction, and at least part of the fourth conductive connection portion 9094 extends along the second direction.

The sub-pixel driving circuits correspond to the sub-pixel areas in a one-to-one manner, and each sub-pixel driving circuit includes a driving transistor, a storage capacitor Cst, a first transistor T1 and a second transistor T2; the driving transistor is used to generate a driving signal for driving the light-emitting element to emit light, the gate electrode of the driving transistor is coupled to the first electrode plate Cst1 of the storage capacitor Cst. Exemplarily, the gate electrode of the driving transistor can be multiplexed as the first electrode plate Cst1 of the storage capacitor Cst.

The gate electrode of the driving transistor can also be coupled to the second electrode D2 of the second transistor T2 through the fourth conductive connection portion 9094 in the corresponding sub-pixel area, and the first electrode S2 of the second transistor T2 is connected to the second electrode of the driving transistor, and the gate electrode 202g of the second transistor T2 is coupled to the gate line pattern 902 in the corresponding sub-pixel area. The second electrode plate Cst2 of the storage capacitor Cst is coupled to the second electrode D1 of the first transistor T1 through the third conductive connection portion 9093 in the corresponding sub-pixel area, and the first electrode of the first transistor T1 S1 is coupled to the data line pattern 908 in the corresponding sub-pixel area, and the gate electrode 201g of the first transistor T1 is coupled to the gate line pattern 902 in the corresponding sub-pixel area.

Since the gate electrode of the driving transistor can be coupled to the second electrode D2 of the second transistor T2 through the fourth conductive connection portion 9094, and can be coupled to the second electrode D2 of the first transistor T1 through the storage capacitor Cst and the third conductive connection portion 9093, so the signals on the third conductive connection portion 9093 and the fourth conductive connection portion 9094 can both affect the gate signal of the driving transistor.

The orthographic projection of the data line pattern 908 on the substrate overlaps the orthographic projection of the gate line pattern 902 on the substrate, and the orthographic projection of the gate line pattern 902 on the substrate does not overlap the orthographic projection of the third conductive connection portion 9093 on the substrate, and/or the orthographic projection of the gate line pattern 902 on the substrate does not overlap the orthographic projection of the fourth conductive connection portion 9094 on the substrate; so that in the same sub-pixel area, in the direction perpendicular to the substrate, the gate line pattern 902 can only overlap the data line pattern 908, but not overlap the third conductive connection portion 9093 and/or the fourth conductive connection portion 9094, thereby preventing forming a series parasitic electricity between the data line pattern 908 and the third conductive connection portion 9093 and/or the fourth conductive connection portion 9094 through the gate line pattern 902, which effectively improves the cross-talk problem of the gate voltage change of the driving transistor caused by the voltage jump of the data signal transmitted on the data line pattern 908.

Therefore, in the display panel provided by the above embodiment, when the display panel is in the light-emitting state, even if the voltage jump of the data signal transmitted on the data line pattern 908 occurs, the gate voltage of the driving transistor will not be changed by the parasitic capacitance. Therefore, the stability of the gate voltage of the driving transistor is well guaranteed, the static crosstalk phenomenon is avoided, and the display quality of the display panel is effectively improved.

As shown in FIG. 8 and FIG. 15, in some embodiments, the display panel further includes:

a power supply signal line layer, the power supply signal line layer includes a power supply signal line pattern 901 located in each of the sub-pixel areas, and at least part of the power supply signal line pattern 901 extends along the second direction;

In the same sub-pixel area, the orthographic projection of the power supply signal line pattern 901 on the substrate is between the orthographic projection of the gate electrode of the driving transistor on the substrate and the orthographic projection of the data line pattern 908 on the substrate.

Specifically, at least part of the power signal line pattern 901 extends along the second direction, and at least part of the data line pattern 908 extends along the second direction. The orthographic projection of the power signal line pattern 901 on the substrate is located between the orthographic projection of the gate electrode of the driving transistor on the substrate and the orthographic projection of the data line pattern 908 on the substrate in the same sub-pixel area, the distance between the data line pattern 908 and the gate electrode of the driving transistor is made farther, and the power signal line pattern 901 can form a good barrier between the data line pattern 908 and the gate electrode of the driving transistor, thereby reducing the lateral parasitic capacitance formed between the data line pattern 908 and the gate electrode of the driving transistor in the same sub-pixel area, effectively improving the stability of the gate potential of the driving transistor.

Figure 19:
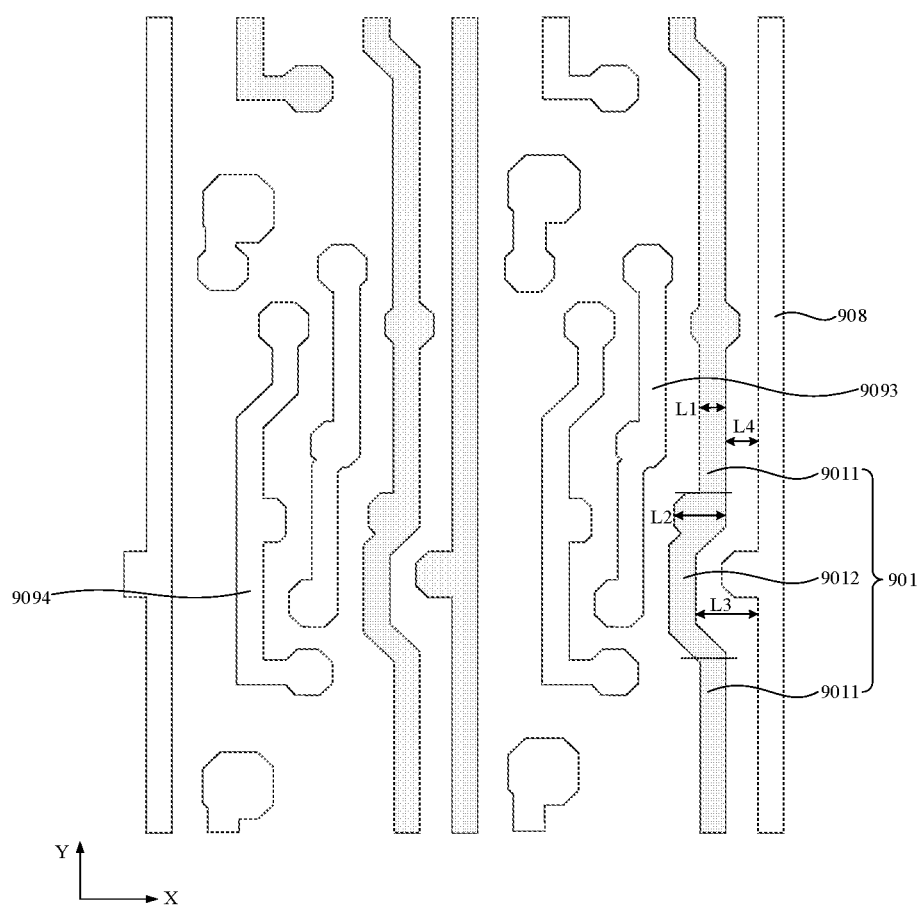
FIG. 19 is a schematic diagram of the layout of the first source-drain metal layer in FIG. 15.

As shown in FIG. 15 and FIG. 19, in some embodiments, the power signal line pattern 901 includes a first power supply portion 9011 and a second power supply portion 9012 coupled to each other, and the first power supply portion 9011 extends along the second direction, the second power supply portion 9012 protrudes from the first power supply portion 9011 in a direction away from the data line pattern 908 in the sub-pixel area where the second power supply portion 9012 is located; in a direction perpendicular to the second direction and parallel to the substrate, the maximum width L1 of the first power supply portion 9011 is smaller than the maximum width L2 of the second power supply portion 9012;

The orthographic projection of the first electrode of the driving transistor (i.e., the first electrode S3 of the third transistor T3) on the substrate overlaps the orthographic projection of the second power supply portion 9012 in the corresponding sub-pixel area on the substrate, and the first electrode of the driving transistor and the second power supply portion 9012 are coupled at the overlapping area.

Specifically, the specific structure of the power supply pattern is various. Exemplarily, the power supply signal line pattern 901 includes a first power supply portion 9011 and a second power supply portion 9012 coupled to each other, and the first power supply portion 9011 extends along the second direction, a first spacing area is formed between the first power supply portion 9011 and the data line pattern 908 in the sub-pixel area where the first power supply portion 9011 is located; the second power supply portion 9012 protrudes from the first power supply portion 9011 along a direction away from the data line pattern in the sub-pixel area where the second supply portion 9012 is located. A second spacing area is formed between the second power supply portion 9012 and the data line pattern 908, along the direction perpendicular to the second direction, the maximum width L3 of the second spacing area is greater than the maximum width L4 of the first spacing area.

The orthographic projection of the first electrode of the driving transistor on the substrate overlaps the orthographic projection of the second power supply portion 9012 in the corresponding sub-pixel area on the substrate, the first electrode of the driving transistor and the second power supply portion 9012 can be coupled through a via hole 69 located at the overlapping area.

In a direction perpendicular to the second direction and parallel to the substrate, the width of the first power supply portion 9011 is smaller than the width of the second power supply portion 9012, and orthographic projection of the first electrode of the driving transistor on the substrate overlaps the orthographic projection of the second power supply portion 9012 in the corresponding sub-pixel area on the substrate, and the first electrode of the driving transistor and the second power supply portion 9012 are coupled at the overlapping area, so that a larger overlapping area may be formed between the orthographic projection of the first electrode of the driving transistor on the substrate and the orthographic projection of the second power supply portion 9012 in the corresponding sub-pixel area on the substrate, a via hole 69 with a larger diameter can be formed at the overlapping area, which is more beneficial for the coupling performance between the first electrode of the driving transistor and the power signal line pattern 901 at the overlapping area.

As shown in FIG. 15 and FIG. 19, in some embodiments, the orthographic projection of the first electrode S1 of the first transistor T1 on the substrate overlaps the orthographic projection of the data line pattern 908 in the corresponding sub-pixel area are on the substrate, and the first electrode S1 of the first transistor T1 and the data line pattern 908 in the corresponding sub-pixel area are coupled through the via hole 68 at the overlapping area; the orthographic projection of the via hole 68 on the substrate and the orthographic projection of the second power supply portion 9012 on the substrate are arranged in a direction perpendicular to the second direction.

Specifically, by arranging the orthographic projection of the via hole 68 on the substrate and the orthographic projection of the second power supply portion 9012 on the substrate to be arranged in a direction perpendicular to the second direction, the via hole 68 can be formed near the second spacing area, and since the distance between the second power supply portion 9012 and the data line pattern 908 is farther in the second spacing area, it is more beneficial to increase the diameter of the via hole 68, thereby effectively improving the coupling performance between the first electrode S1 of the first transistor T1 and the data line pattern 908.

As shown in FIG. 8 and FIG. 15, in some embodiments, the display panel further includes:

a gate line pattern 902 and a reset signal line pattern 905 in each of the sub-pixel areas, a gate line pattern 902 in the current sub-pixel area and a reset signal line pattern 905 in a next sub-pixel area adjacent along the second direction form a integral structure.

Specifically, at least part of each of the gate line patterns 902 extends along the first direction, and the gate line patterns 902 located in the same row of sub-pixel areas along the first direction are electrically connected in sequence to form an integral structure; each of the reset signal line patterns 905 extends along the first direction, the gate line pattern 902 in the current sub-pixel area and the reset signal line pattern 905 in the next sub-pixel area adjacent along the second direction form an integral structure through a connecting portion extending along the second direction.

The gate line pattern 902, the reset signal line pattern 905, and the light-emitting control signal line pattern 903 included in the display panel can all be made of the first gate metal layer, so that the gate line pattern 902, the reset signal line pattern 905 and the light-emitting control signal line pattern 903 can be formed in the same patterning process, thereby effectively simplifying the manufacturing process and saving the production cost.

The gate line pattern 902 in the current sub-pixel area and the reset signal line pattern 905 in the next sub-pixel area adjacent along the second direction form an integral structure, so that the scan signal transmitted on the gate line pattern 902 in the previous row of sub-pixel areas can be used as the reset signal transmitted on the reset signal line pattern 905 in the current row of sub-pixels, so as to avoid introducing a dedicated signal transmission path for providing the reset signal for the reset signal line pattern 905, which effectively reduces the layout space occupied by the reset signal line pattern 905, is more conducive to improving the resolution of the display panel. The above layout method can support a display panel with a pixel resolution of 400 PPI.

As shown in FIG. 11 and FIG. 17, in some embodiments, the display panel further includes a transistor structure, and the initialization signal line pattern and the active layer in the transistor structure are arranged at the same layer and made of the same material.

Specifically, the initialization signal line pattern 904 and the active layer in the driving transistor are arranged at the same layer and made of the same material, it enables the initialization signal line pattern 904 and the active layer to be formed in the same patterning process. Moreover, since the first electrode (or the second electrode) of the transistor structure in the display panel coupled to the initialization signal line pattern 904 is also made of the active layer, the first electrode (or the second electrode) can be formed into an integral structure with the initialization signal line pattern 904 coupled thereto, thereby further saving the layout space occupied by the transistor structure and the initialization signal line pattern 904, and improving the resolution of the display panel.

In some embodiments, the display panel further includes: a power signal line pattern, a data line pattern, a gate line pattern, a reset signal line pattern, and a light-emitting control signal line pattern in each of the sub-pixel areas; and the sub-pixel driving circuits corresponding to the sub-pixel areas in a one-to-one manner, each of the sub-pixel driving circuits includes: a first transistor, a second transistor, a third transistor, a fourth transistor, a fifth transistor, a sixth transistor, a seventh transistor, an eighth transistor, and a ninth transistor;

a gate electrode of the first transistor is coupled to the gate line pattern, a first electrode of the first transistor is coupled to the data line pattern, and a second electrode of the first transistor is coupled to a second electrode plate of the storage capacitor, and the first electrode plate of the storage capacitor is coupled to a gate electrode of the third transistor;

a gate electrode of the second transistor is coupled to the gate line pattern, a first electrode of the second transistor is coupled to a second electrode of the third transistor, and a second electrode of the second transistor is coupled to the gate electrode of the third transistor;

a first electrode of the third transistor is coupled to the power signal line pattern;

a gate electrode of the fourth transistor is coupled to the reset signal line pattern, a first electrode of the fourth transistor is coupled to the initialization signal line pattern, and a second electrode of the fourth transistor is coupled to the gate electrode of the third transistor;

a gate electrode of the fifth transistor is coupled to the reset signal line pattern, a first electrode of the fifth transistor is coupled to the initialization signal line pattern, and a second electrode of the fifth transistor is coupled to the second electrode plate of the storage capacitor;

a gate electrode of the sixth transistor is coupled to the light-emitting control signal line pattern, a first electrode of the sixth transistor is coupled to the initialization signal line pattern, and a second electrode of the sixth transistor is coupled to the second electrode plate of the storage capacitor;

a gate electrode of the seventh transistor is coupled to the light-emitting control signal line pattern, a first electrode of the seventh transistor is coupled to the second electrode of the third transistor, and a second electrode of the seventh transistor is connected to the corresponding anode pattern in the display panel;

a gate electrode of the eighth transistor is coupled to the reset signal line pattern, a first electrode of the eighth transistor is coupled to the initialization signal line pattern, and a second electrode of the eighth transistor is coupled to the corresponding anode pattern;

a gate electrode of the ninth transistor is coupled to a corresponding light-emitting control signal line pattern, a first electrode of the ninth transistor is coupled to the gate electrode of the third transistor, and a second electrode of the ninth transistor is floating.

Figure 1:
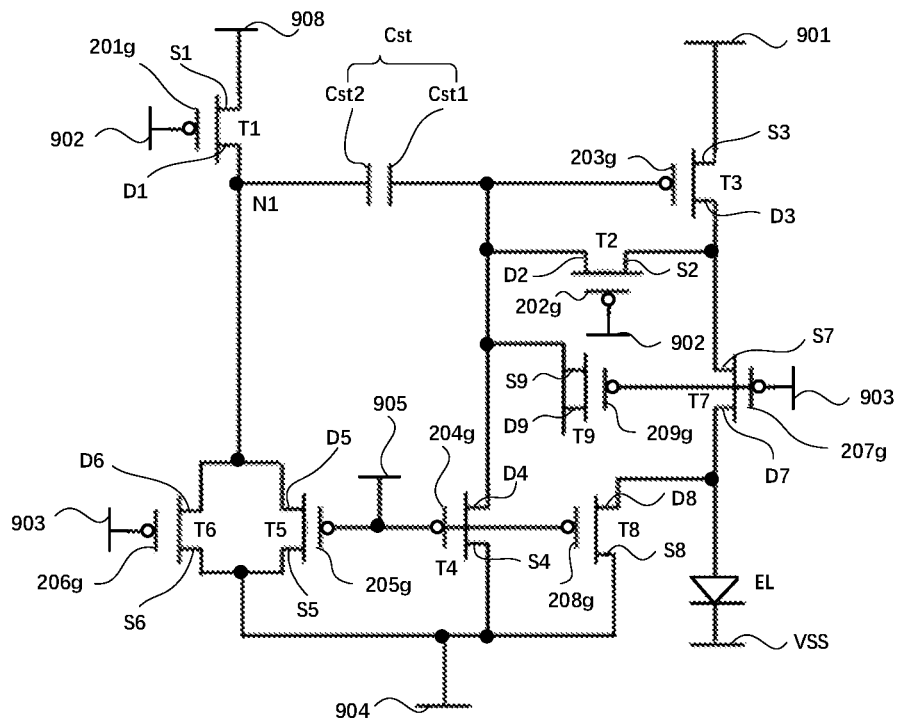
FIG. 1 is a circuit diagram of a sub-pixel driving circuit provided by an embodiment of the present disclosure.

Specifically, as shown in FIG. 1, FIG. 8 and FIG. 15, the gate electrode 201g of the first transistor T1 is coupled to the gate line pattern 902, and the first electrode S1 of the first transistor T1 is connected to the data line pattern 908, the second electrode D1 of the first transistor T1 is coupled to the second electrode plate Cst2 of the storage capacitor Cst, the first electrode plate Cst1 of the storage capacitor Cst is coupled to the gate electrode 203g of the third transistor T3 (i.e., the driving transistor);

The gate electrode 202g of the second transistor T2 is coupled to the gate line pattern 902, the first electrode S2 of the second transistor T2 is coupled to the second electrode D3 of the third transistor T3, the second electrode D2 of the second transistor T2 is coupled to the gate electrode 203g of the third transistor T3;

The first electrode S3 of the third transistor T3 is coupled to the power signal line pattern 901;

The gate electrode 204g of the fourth transistor T4 is coupled to the reset signal line pattern 905, the first electrode S4 of the fourth transistor T4 is coupled to the initialization signal line pattern 904, and the second electrode D4 of the fourth transistor T4 is coupled to the gate electrode 203g of the third transistor T3;

The gate electrode 205g of the fifth transistor T5 is coupled to the reset signal line pattern 905, the first electrode S5 of the fifth transistor T5 is coupled to the initialization signal line pattern 904, and the second electrode D5 of the fifth transistor T5 coupled to the second electrode plate Cst2 of the storage capacitor Cst;

The gate electrode 206g of the sixth transistor T6 is coupled to the light-emitting control signal line pattern 903, the first electrode S6 of the sixth transistor T6 is coupled to the initialization signal line pattern 904, and the second electrode D6 of the sixth transistor T6 is coupled to the second electrode plate Cst2 of the storage capacitor Cst;

The gate electrode 207g of the seventh transistor T7 is coupled to the light-emitting control signal line pattern 903, the first electrode S7 of the seventh transistor T7 is coupled to the second electrode D3 of the third transistor T3, and the second electrode D7 of the seventh transistor T7 is coupled to the anode pattern 906 of the corresponding light-emitting element EL, and the cathode of the light-emitting element EL is coupled to the negative power signal line VS S;

The gate electrode 208g of the eighth transistor T8 is coupled to the reset signal line pattern 905, the first electrode S8 of the eighth transistor T8 is coupled to the initialization signal line pattern 904, and the second electrode D8 of the eighth transistor T8 is coupled to the anode pattern 906 of the corresponding light emitting element EL.

At least part of the power signal line pattern 901 and the data line pattern 908 extend along the second direction; at least part of the gate line pattern 902, the light-emitting control signal line pattern 903, and the reset signal line pattern 905 all extend along the first direction. The first direction intersects the second direction. Exemplarily, the first direction includes the X direction, and the second direction includes the Y direction.

The plurality of sub-pixel areas can be divided into a plurality of rows of sub-pixel areas arranged in sequence along the second direction, and a plurality of columns of sub-pixel areas arranged in sequence along the first direction, and gate line patterns 902 in the same row of the sub-pixel areas are electrically connected in sequence to form an integral structure; the light-emitting control signal line patterns 903 located in the same row of sub-pixel areas are sequentially electrically connected to form an integral structure; the data line patterns located in the same column of sub-pixel areas 908 are electrically connected in sequence to form an integral structure; the power signal line patterns 901 located in the same column of sub-pixel areas are electrically connected in sequence to form an integral structure.

The layout of film layers in the display panel is as follows: a buffer layer, a sub-pixel driving circuit film layer, an anode layer, a pixel defining layer and a spacer layer 70 that are sequentially stacked on the substrate along the direction away from the substrate. The layout of film layers corresponding to the sub-pixel driving circuit is as follows: an active film layer, a first gate insulating layer, a first gate metal layer, a second gate insulating layer, a second gate metal layer, an interlayer insulating layer, a first source-drain metal layer and a planarization layer that are sequentially stacked on the substrate along the direction away from the substrate.

As shown in FIG. 11 and FIG. 17, the active film layer is used to form channel areas (e.g.: 101g-109g) of transistors in the sub-pixel driving circuit, first electrodes (e.g.: S1-S9) and the second electrodes (e.g.: D1-D9). Due to the doping effect, the conductivity of the active film layers corresponding to the first and second electrodes will be better than that of the active film layer corresponding to the channel area; the active film layer can be made of amorphous silicon, polysilicon, oxide semiconductor materials, etc. It should be noted that, the first electrode and the second electrode may be doped with n-type impurities or p-type impurities. In addition, it should be noted that the active film layer corresponding to the first electrode and the second electrode can be directly used as the source electrode or drain electrode of the corresponding transistor, or the source electrode in contact with the first electrode is made of a metal material, the drain electrode in contact with the second electrode is made of a metal material.

The active film layer is also used to form the initialization signal line pattern 904, and the portion of the active film layer used to form the initialization signal line pattern 904 can have good electrical conductivity due to doping.

Figure 12:
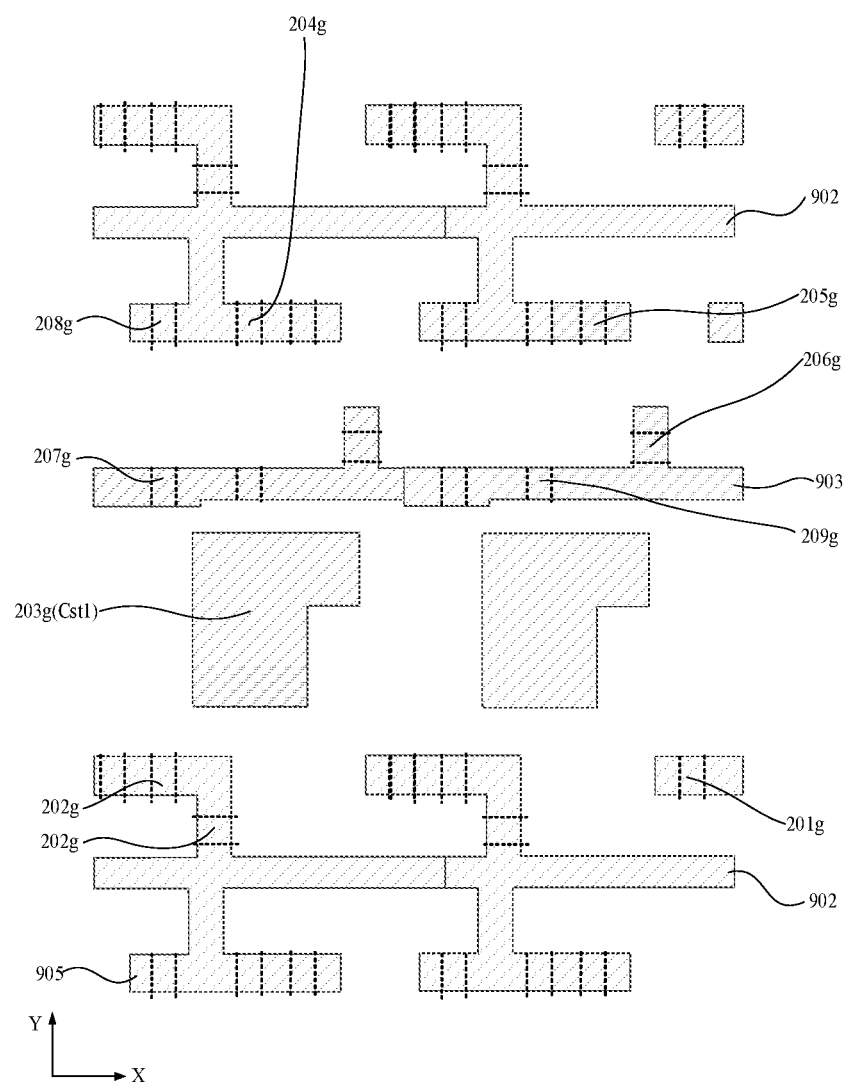
FIG. 12 is a schematic diagram of the layout of the first gate metal layer in FIG. 8.

As shown in FIG. 12, the first gate metal layer is used to form the gate electrodes of the transistors in the sub-pixel driving circuit (e.g., 201g-209g), as well as the gate line pattern 902, the light-emitting control signal line pattern 903, and the reset signal line patterns 905 included in the display panel, the gate electrode 203g of the third transistor T3 in each sub-pixel driving circuit is multiplexed as the first electrode plate Cst1 of the storage capacitor Cst in the sub-pixel driving circuit.

As shown in FIG. 13 and FIG. 18, the second gate metal layer is used to form the second electrode plate Cst2 of the storage capacitor Cst, and the second auxiliary signal line layer and the third auxiliary signal line layer included in the display panel.

The first source-drain metal layer is used to form data line patterns 908, power signal line patterns 901 and some conductive connection portions.

Figure 2:
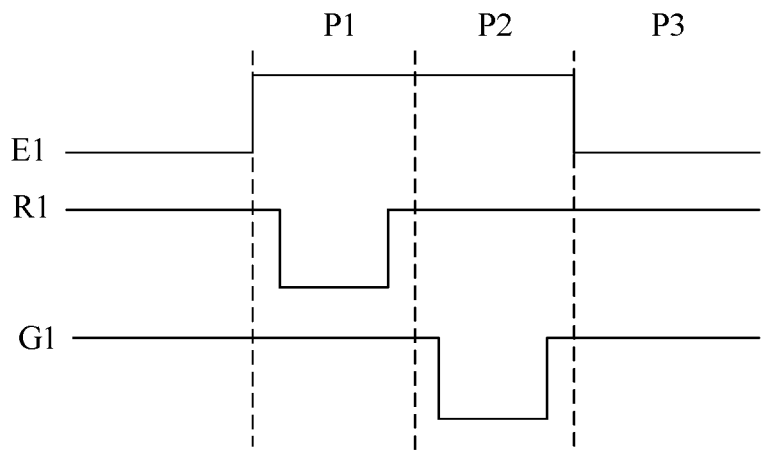
FIG. 2 is a working timing diagram of a sub-pixel driving circuit provided by an embodiment of the present disclosure.

As shown in FIG. 2, when the sub-pixel driving circuit with the above structure is in operation, each working cycle includes a reset period P1, a writing-in compensation period P2 and a light-emitting period P3. In FIG. 2, E1 represents the light-emitting control signal transmitted on the light-emitting control signal line pattern 903 in the current sub-pixel area, R1 represents the reset signal transmitted on the reset signal line pattern 905 in the current sub-pixel area, and G1 represents the gate scan signal transmitted on the gate line pattern 902 in current sub-pixel area.

During the reset period P1, the reset signal inputted by the reset signal line pattern 905 is at a valid level, the fourth transistor T4, the fifth transistor T5 and the eighth transistor T8 are turned on, and the initialization signal transmitted by the initialization signal line pattern 904 is inputted to the gate electrode 203g of the third transistor T3, the anode pattern 906 and the second electrode plate of the storage capacitor, so that the gate-source voltage Vgs maintained on the third transistor T3 in the previous frame is cleared, and the gate electrode 203g of the third transistor T3 is reset, and at the same time, the anode pattern 906 and the second electrode plate of the storage capacitor are reset.

During the writing-in compensation period P2, the reset signal inputted by the reset signal line pattern 905 is at an invalid level, the fourth transistor T4, the fifth transistor T5 and the eighth transistor T8 are all turned off, and the scan signal inputted by the gate line pattern 902 is at a valid level, to control the first transistor T1 and the second transistor T2 to be turned on, the data signal is written by data line pattern 908, and is transmitted to the N1 node through the first transistor T1, and is coupled to the gate electrode of the third transistor T3 through the storage capacitor. At the same time, the first transistor T1 and the second transistor T2 are turned on, so that the third transistor T3 is formed into a diode structure. Therefore, the first transistor T1, the third transistor T3 and the second transistor T2 work together, so that the threshold voltage of the third transistor T3 is compensated.

When the compensation time is long enough, the potential of the gate electrode 203g of the third transistor T3 can be controlled to finally reach Vth+VDD, where VDD is the power signal voltage value, and Vth represents the threshold voltage of the third transistor T3.

In the light-emitting period P3, the light-emitting control signal written by the light-emitting control signal line pattern 903 is at a valid level, the sixth transistor T6 and the seventh transistor T7 are controlled to be turned on, and the power supply signal transmitted by the power supply signal line pattern 901 is inputted to the source electrode of the third transistor. At the same time, due to the coupling effect of the storage capacitor, the gate electrode 203g of the third transistor T3 becomes Vint−Vdata+Vth+VDD, where Vdata represents the data signal voltage value, and Vint represents the initial signal voltage value, so that the third transistor T3 is turned on, the gate-source voltage corresponding to the third transistor T3 is Vdata−Vint+Vth, and the current generated based on the gate-source voltage flows to the anode pattern 906 of the corresponding light-emitting element EL to drive the corresponding light-emitting element EL to emit light.

As shown in FIG. 1, FIG. 8 and FIG. 15, in some embodiments, the sub-pixel driving circuit further includes a ninth transistor T9, and the gate electrode 209 g of the ninth transistor T9 is coupled to the light-emitting control signal line pattern 903, the first electrode S9 of the ninth transistor T9 is coupled to the gate electrode 203g of the third transistor T3, and the second electrode D9 of the ninth transistor T9 is floating.

Specifically, in the reset period P1 and the writing-in compensation period P2, the light emitting control signal written by the light emitting control signal line pattern 903 is at an invalid level, and the ninth transistor T9 is controlled to be turned off. In the light-emitting period P3, the light-emitting control signal written by the light-emitting control signal line pattern 903 is at a valid level, and the ninth transistor T9 is controlled to be turned on.

The sub-pixel driving circuit includes the ninth transistor T9, so that during the light-emitting period, by turning on the ninth transistor T9, the excess charge accumulated on the gate electrode 203g of the third transistor T3 can be released to ensure that the potential of the gate electrode 203g of the third transistor T3 is stabilized.

It should be noted that when entering the light-emitting period P3 from the writing-in compensation period P2, the potential of the scan signal inputted by the gate line pattern 902 increases, thereby pulling the potential of the gate electrode 203g of the third transistor T3, so that excess charges are accumulated on the gate electrode 203g of the third transistor T3.

Embodiments of the present disclosure further provide a display device, including the display panel provided by the above embodiments.

In the display panel provided by the above embodiments, the first auxiliary signal line layer is disposed on the side of the initialization signal line layer away from the substrate, and the first auxiliary signal line pattern in the first auxiliary signal line layer is coupled to the initialization signal line pattern in the corresponding sub-pixel area, and in the same row of sub-pixel areas, the first auxiliary signal line patterns corresponding to the sub-pixel areas are sequentially coupled; so that in the display panel, the initialization signal line patterns in the same row of sub-pixel areas can be coupled together through the corresponding first auxiliary signal line pattern. It can be seen that in the display panel provided by the above-mentioned embodiments, it is not necessary to use the spacing area between the anode patterns to form a grid connection among the initialization signal line patterns in each sub-pixel area in the display panel, that is, it is not necessary to form two via holes penetrating the planarization layer PLN in each sub-pixel area. Therefore, the display panel provided by the above embodiments effectively reduces the layout space required for each pixel area while realizing the coupling of initialization signal line patterns located in the same row of sub-pixel areas, which is more beneficial to the high-resolution development of the display panel. It should be noted that the display panel provided by the embodiments of the present disclosure can achieve 530 PPI (Pixels Per Inch, Pixel Density).

In addition, in the display panel provided by the above embodiment, the first auxiliary signal line pattern does not need to occupy the anode spacing area, so that the anode pattern and the pixel defining layer in the display panel can utilize a larger layout space, which is more beneficial to reduce the layout difficulty of the anode pattern and the pixel definition layer.

Therefore, when the display device provided by the embodiment of the present disclosure includes the above-mentioned display panel, it also has the above-mentioned beneficial effects, which will not be repeated here.

It should be noted that the display device may be any product or component with a display function, such as a TV, a monitor, a digital photo frame, a mobile phone, a tablet computer, and the like.

Embodiments of the present disclosure further provide a method of manufacturing a display panel provided in the above-mentioned embodiments, wherein the display panel includes a plurality of sub-pixel areas arranged in an array, and the plurality of sub-pixel areas are formed as a plurality of rows of sub-pixel areas arranged in sequence along the second direction, each row of sub-pixel areas includes a plurality of sub-pixel areas arranged along a first direction, and the first direction intersects the second direction; the method includes:

forming an initialization signal line layer and a first auxiliary signal line layer that are stacked in sequence on the substrate along a direction away from the substrate;

The initialization signal line layer includes an initialization signal line pattern arranged in each of the sub-pixel areas;

The first auxiliary signal line layer includes a plurality of first auxiliary signal line patterns corresponding to the plurality of sub-pixel areas in a one-to-one manner, and the first auxiliary signal line pattern is coupled to the initialization signal line pattern in the corresponding sub-pixel area; at least part of the first auxiliary signal line pattern extends along the first direction, and in the same row of sub-pixel areas, the first auxiliary signal line patterns corresponding to the sub-pixel areas are sequentially coupled.

In the display panel manufactured by the method provided by the embodiment of the present disclosure, the first auxiliary signal line layer is disposed on the side of the initialization signal line layer away from the substrate, and the first auxiliary signal line pattern in the first auxiliary signal line layer is coupled to the initialization signal line pattern in the corresponding sub-pixel area, and in the same row of sub-pixel areas, the first auxiliary signal line patterns corresponding to the sub-pixel areas are sequentially coupled; so that in the display panel, the initialization signal line patterns in the same row of sub-pixel areas can be coupled together through the corresponding first auxiliary signal line pattern. It can be seen that in the display panel provided by the above-mentioned embodiments, it is not necessary to use the spacing area between the anode patterns to form a grid connection among the initialization signal line patterns in each sub-pixel area in the display panel, that is, it is not necessary to form two via holes penetrating the planarization layer PLN in each sub-pixel area. Therefore, the display panel provided by the above embodiments effectively reduces the layout space required for each pixel area while realizing the coupling of initialization signal line patterns located in the same row of sub-pixel areas, which is more beneficial to the high-resolution development of the display panel. It should be noted that the display panel provided by the embodiments of the present disclosure can achieve 530 PPI (Pixels Per Inch, Pixel Density).

In addition, in the display panel manufactured by the method provided by the embodiment of the present disclosure, the first auxiliary signal line pattern does not need to occupy the anode spacing area, so that the anode pattern and the pixel definition layer in the display panel may utilize larger layout space, which is more beneficial to reduce the layout difficulty of the anode pattern and the pixel definition layer.

It should be noted that the various embodiments in this specification are described in a progressive manner, and the same or similar parts among the various embodiments can be referred to each other, and each embodiment focuses on the differences from other embodiments. In particular, for the method embodiment, since it is basically similar to the product embodiment, the description is relatively simple, and the relevant portion can be referred to the description of the product embodiment.

Unless otherwise defined, the technical or scientific terms used in the present disclosure shall have the usual meanings understood by those with ordinary skills in the field to which this disclosure belongs. The "first", "second" and similar words used in the present disclosure do not indicate any order, quantity or importance, but are only used to distinguish different components. The word "include" or "comprise" and other similar words mean that the element or item appearing before the word encompasses the element or item listed after the word and its equivalents, but does not exclude other elements or items. Similar words such as "connected" or "coupled" are not limited to physical or mechanical connections, but may include electrical connections, whether direct or indirect. "Up", "Down", "Left", "Right", etc. are only used to indicate the relative position relationship. When the absolute position of the described object changes, the relative position relationship may also change accordingly.

It can be understood that when an element such as a layer, film, area, or substrate is referred to as being "on" or "under" another element, the element can be "directly" on or "under" the other element, or there may be intermediate elements therebetween.

In the description of the foregoing embodiments, specific features, structures, materials, or characteristics may be combined in any one or more embodiments or examples in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising: a substrate, an initialization signal line layer and a first auxiliary signal line layer sequentially stacked on the substrate along a direction away from the substrate; and a plurality of sub-pixel areas arranged in an array, wherein the plurality of sub-pixel areas form a plurality of rows of sub-pixel areas arranged in sequence along a second direction, each row of sub-pixel areas includes a plurality of sub-pixel areas arranged along a first direction, the first direction and the second direction intersect;

the initialization signal line layer includes an initialization signal line pattern arranged in each of the plurality of sub-pixel areas;

the first auxiliary signal line layer includes a plurality of first auxiliary signal line patterns corresponding to the plurality of sub-pixel areas in a one-to-one manner, and the first auxiliary signal line pattern is coupled to an initialization signal line pattern in a corresponding sub-pixel area, at least part of the first auxiliary signal line pattern extends along the first direction, and first auxiliary signal line patterns corresponding to sub-pixel areas in a same row of sub-pixel areas are sequentially coupled, the display panel further includes a transistor structure, the initialization signal line pattern and an active layer in the transistor structure are arranged at a same layer, wherein the display panel further comprises: a conductive connection portion layer located on a side of the first auxiliary signal line layer away from the substrate, wherein the conductive connection portion layer includes second conductive connection portions corresponding to the plurality of the sub-pixel areas in a one-to-one manner; in the same sub-pixel area, there is a first overlapping area between an orthographic projection of the second conductive connection portion on the substrate and an orthographic projection of the initialization signal line pattern on the substrate, and there is a second overlapping area between the orthographic projection of the second conductive connection portion on the substrate and the first auxiliary signal line pattern, the second conductive connection portion is coupled to the initialization signal line pattern in the first overlapping area, and the second conductive connection portion is coupled to the first auxiliary signal line layer pattern in the second overlapping area, wherein the first auxiliary signal line pattern includes a first portion and a second portion coupled to each other, and the first portion extends along the first direction, the second portion protrudes from the first portion along a direction perpendicular to the first direction; an orthographic projection of the first portion on the substrate overlaps the orthographic projection of the initialization signal line pattern on the substrate overlap, and an orthographic projection of the second portion on the substrate does not overlap the orthographic projection of the initialization signal line pattern on the substrate; in the same sub-pixel area, there is the second overlapping area between the orthographic projection of the second portion on the substrate and the orthographic projection of the second conductive connection portion on the substrate.

2. The display panel according to claim 1, wherein there is a third overlapping area between the orthographic projection of the first auxiliary signal line pattern on the substrate and the orthographic projection of the initialization signal line pattern on the substrate, the first auxiliary signal line pattern is directly coupled to the initialization signal line pattern through a via hole located in the third overlapping area.

3. The display panel according to claim 2, wherein the first auxiliary signal line pattern includes a third portion and a fourth portion, the third portion extends along the first direction, in a direction perpendicular to the first direction, a width of the fourth portion is greater than a width of the third portion; there is the third overlapping area between an orthographic projection of the fourth portion on the substrate and the orthographic projection of the initialization signal line pattern on the substrate.

4. The display panel according to claim 1, wherein the display panel further includes a power signal line layer and a data line layer that are sequentially stacked on the first auxiliary signal line layer along a direction away from the substrate;
the power signal line layer includes a power signal line pattern located in each of the plurality of sub-pixel areas, and at least part of the power signal line pattern extends along the second direction;
the data line layer includes a data line pattern located in each of the plurality of sub-pixel areas, and at least part of the data line pattern extends along the second direction;
in the same sub-pixel area, an orthographic projection of the power signal line pattern on the substrate overlaps an orthographic projection of the data line pattern on the substrate.

5. The display panel according to claim 1, wherein the display panel further comprises:
a power supply signal line layer located on a side of the initialization signal line layer away from the substrate, wherein the power supply signal line layer includes a power supply signal line pattern arranged in each of the plurality of sub-pixel areas, at least part of the power supply signal line pattern extends along the second direction;
a third auxiliary signal line layer located between the initialization signal line layer and the power supply signal line layer, wherein the third auxiliary signal line layer includes a third auxiliary signal line pattern located in each of the plurality of sub-pixel areas, at least part of the third auxiliary signal line pattern extends along the first direction; in the same sub-pixel area, there is a fourth overlapping area between an orthographic projection of the third auxiliary signal line pattern on the substrate and an orthographic projection of the power signal line pattern on the substrate, and the third auxiliary signal line pattern is coupled to the power signal line pattern in the fourth overlapping area; third auxiliary signal line patterns in a same row of sub-pixel areas along the first direction are sequentially coupled.

6. The display panel according to claim 5, wherein the display panel further comprises:
a light-emitting control signal line layer, wherein the light-emitting control signal line layer includes a light-emitting control signal line pattern located in each of the plurality of sub-pixel areas, and at least part of the light-emitting control signal line pattern extends along the first direction;
a reset signal line layer, wherein the reset signal line layer includes a reset signal line pattern located in each of the plurality of sub-pixel areas, and the reset signal line pattern extends along the first direction;
in the same sub-pixel area, the orthographic projection of the third auxiliary signal line pattern on the substrate is located between the orthographic projection of the light-emitting control signal line pattern on the substrate and the orthographic projection of the reset signal line pattern on the substrate, the third auxiliary signal line pattern is formed in a wavy structure.

7. The display panel according to claim 5, wherein the display panel further comprises a transistor structure and a storage capacitor, and the storage capacitor includes a first electrode plate and a second electrode plate opposite to each other, the first electrode plate is located between the substrate and the second electrode plate, and the first electrode plate and a gate electrode of the transistor structure are arranged at a same layer and made of a same material; the first auxiliary signal line layer and/or the third auxiliary signal line layer are arranged at a same layer and made of a same material as the second electrode plate.

8. The display panel according to claim 1, wherein the display panel further comprises:
a gate line layer, wherein the gate line layer includes a gate line pattern located in each of the plurality of sub-pixel areas, and at least part of the gate line pattern extends along the first direction;
a data line layer, wherein the data line layer includes a data line pattern located in each of the plurality of sub-pixel areas, at least part of the data line pattern extends along the second direction, and an orthographic projection of the data line pattern on the substrate overlaps an orthographic projection of the gate line pattern on the substrate;
a conductive connection portion layer, wherein the conductive connection portion layer includes a third conductive connection portion and a fourth conductive connection portion located in each of the plurality of sub-pixel areas;
sub-pixel driving circuits corresponding to the plurality of sub-pixel areas in a one-to-one manner, each of the plurality of sub-pixel driving circuits includes: a driving transistor, a storage capacitor, a first transistor and a second transistor; a gate electrode of the driving transistor is multiplexed as a first electrode plate of the storage capacitor, and the gate electrode of the driving transistor is coupled to a second electrode of the second transistor through the fourth conductive connection portion in the corresponding sub-pixel area, and the second electrode plate of the storage capacitor is coupled to a second electrode of the first transistor through the third conductive connection portion in the corresponding sub-pixel area; a gate electrode of the first transistor and a gate electrode of the second transistor are respectively coupled to the gate line pattern in the corresponding sub-pixel area; an orthographic projection of the gate line pattern on the substrate does not overlap an orthographic projection of the third conductive connection portion on the substrate, and/or the orthographic projection of the gate line pattern on the substrate does not overlap an orthographic projection of the fourth conductive connection portion on the substrate.

9. The display panel according to claim 1, further comprising:
a gate line pattern and a reset signal line pattern arranged in each of the plurality of sub-pixel areas, a gate line pattern in a current sub-pixel area and a reset signal line pattern in a next sub-pixel area adjacent along the second direction form an integral structure.

10. The display panel according to claim 1, wherein the initialization signal line pattern and the active layer in the transistor structure are made of a same material.

11. The display panel according to claim 1, wherein the display panel further comprises: a power signal line pattern, a data line pattern, a gate line pattern, a reset signal line pattern, and a light-emitting control signal line pattern in each of the plurality of sub-pixel areas; and the sub-pixel driving circuits corresponding to the plurality of sub-pixel areas in a one-to-one manner, each of sub-pixel driving circuits includes: a first transistor, a second transistor, a third transistor, a fourth transistor, a fifth transistor, a sixth transistor, a seventh transistor, an eighth transistor, and a ninth transistor;
- a gate electrode of the first transistor is coupled to the gate line pattern, a first electrode of the first transistor is coupled to the data line pattern, and a second electrode of the first transistor is coupled to a second electrode plate of the storage capacitor, and a first electrode plate of the storage capacitor is coupled to a gate electrode of the third transistor;
- a gate electrode of the second transistor is coupled to the gate line pattern, a first electrode of the second transistor is coupled to a second electrode of the third transistor, and a second electrode of the second transistor is coupled to the gate electrode of the third transistor;
- a first electrode of the third transistor is coupled to the power signal line pattern;
- a gate electrode of the fourth transistor is coupled to the reset signal line pattern, a first electrode of the fourth transistor is coupled to the initialization signal line pattern, and a second electrode of the fourth transistor is coupled to the gate electrode of the third transistor;
- a gate electrode of the fifth transistor is coupled to the reset signal line pattern, a first electrode of the fifth transistor is coupled to the initialization signal line pattern, and a second electrode of the fifth transistor is coupled to a second electrode plate of the storage capacitor;
- a gate electrode of the sixth transistor is coupled to the light-emitting control signal line pattern, a first electrode of the sixth transistor is coupled to the initialization signal line pattern, and a second electrode of the sixth transistor is coupled to the second electrode plate of the storage capacitor;
- a gate electrode of the seventh transistor is coupled to the light-emitting control signal line pattern, a first electrode of the seventh transistor is coupled to the second electrode of the third transistor, and a second electrode of the seventh transistor is coupled to a corresponding anode pattern in the display panel;
- a gate electrode of the eighth transistor is coupled to the reset signal line pattern, a first electrode of the eighth transistor is coupled to the initialization signal line pattern, and a second electrode of the eighth transistor is coupled to the corresponding anode pattern;
- a gate electrode of the ninth transistor is coupled to a corresponding light-emitting control signal line pattern, a first electrode of the ninth transistor is coupled to the gate electrode of the third transistor, and a second electrode of the ninth transistor is floating.

12. A display device comprising the display panel according to claim 1.

13. A method of manufacturing a display panel, wherein the display panel includes a plurality of sub-pixel areas arranged in an array, and the plurality of sub-pixel areas are formed as a plurality of rows of sub-pixel areas arranged in sequence along a second direction, each row of sub-pixel areas includes a plurality of sub-pixel areas arranged along a first direction, and the first direction intersects the second direction; the method includes:
- forming an initialization signal line layer and a first auxiliary signal line layer that are stacked in sequence on the substrate along a direction away from the substrate;
- the initialization signal line layer includes an initialization signal line pattern arranged in each of plurality of the sub-pixel areas;
- the first auxiliary signal line layer includes a plurality of first auxiliary signal line patterns corresponding to the plurality of sub-pixel areas in a one-to-one manner, and the first auxiliary signal line pattern is coupled to the initialization signal line pattern in the corresponding sub-pixel area; at least part of the first auxiliary signal line pattern extends along the first direction, and in a same row of sub-pixel areas, the first auxiliary signal line patterns corresponding to the plurality of sub-pixel areas are sequentially coupled,
- the display panel further includes a transistor structure, the initialization signal line pattern and an active layer in the transistor structure are arranged at a same layer,
- wherein the display panel further comprises: a conductive connection portion layer located on a side of the first auxiliary signal line layer away from the substrate, wherein the conductive connection portion layer includes second conductive connection portions corresponding to the plurality of the sub-pixel areas in a one-to-one manner; in the same sub-pixel area, there is a first overlapping area between an orthographic projection of the second conductive connection portion on the substrate and an orthographic projection of the initialization signal line pattern on the substrate, and there is a second overlapping area between the orthographic projection of the second conductive connection portion on the substrate and the first auxiliary signal line pattern, the second conductive connection portion is coupled to the initialization signal line pattern in the first overlapping area, and the second conductive connection portion is coupled to the first auxiliary signal line layer pattern in the second overlapping area,
- wherein the first auxiliary signal line pattern includes a first portion and a second portion coupled to each other, and the first portion extends along the first direction, the second portion protrudes from the first portion along a direction perpendicular to the first direction; an orthographic projection of the first portion on the substrate overlaps the orthographic projection of the initialization signal line pattern on the substrate overlap, and an orthographic projection of the second portion on the substrate does not overlap the orthographic projection of the initialization signal line pattern on the substrate; in the same sub-pixel area, there is the second overlapping area between the orthographic projection of the second portion on the substrate and the orthographic projection of the second conductive connection portion on the substrate.

14. A display panel, comprising: a substrate, an initialization signal line layer and a first auxiliary signal line layer sequentially stacked on the substrate along a direction away from the substrate; and a plurality of sub-pixel areas arranged in an array; wherein the plurality of sub-pixel areas form a plurality of rows of sub-pixel areas arranged in sequence along a second direction, each row of sub-pixel areas includes a plurality of sub-pixel areas arranged along a first direction, the first direction and the second direction intersect;

the initialization signal line layer includes an initialization signal line pattern arranged in each of the plurality of sub-pixel areas;

the first auxiliary signal line layer includes a plurality of first auxiliary signal line patterns corresponding to the plurality of sub-pixel areas in a one-to-one manner, and the first auxiliary signal line pattern is coupled to an initialization signal line pattern in a corresponding sub-pixel area, at least part of the first auxiliary signal line pattern extends along the first direction, and first auxiliary signal line patterns corresponding to sub-pixel areas in a same row of sub-pixel areas are sequentially coupled, the display panel further includes a transistor structure, the initialization signal line pattern and an active layer in the transistor structure are arranged at a same layer, wherein there is a third overlapping area between the orthographic projection of the first auxiliary signal line pattern on the substrate and the orthographic projection of the initialization signal line pattern on the substrate, the first auxiliary signal line pattern is directly coupled to the initialization signal line pattern through a via hole located in the third overlapping area, wherein the first auxiliary signal line pattern includes a third portion and a fourth portion, the third portion extends along the first direction, in a direction perpendicular to the first direction, a width of the fourth portion is greater than a width of the third portion; there is the third overlapping area between an orthographic projection of the fourth portion on the substrate and the orthographic projection of the initialization signal line pattern on the substrate.

* * * * *